(12) United States Patent
Lin

(10) Patent No.: US 8,537,504 B2
(45) Date of Patent: Sep. 17, 2013

(54) CURRENT-PERPENDICULAR-TO-PLANE (CPP) READ SENSOR WITH FERROMAGNETIC BUFFER, SHIELDING AND SEED LAYERS

(75) Inventor: Tsann Lin, Saratoga, CA (US)

(73) Assignee: HGST Netherlands B.V., Amsterdam (NL)

( * ) Notice: Subject to any disclaimer, the term of this patent is extended or adjusted under 35 U.S.C. 154(b) by 255 days.

(21) Appl. No.: 12/884,091

(22) Filed: Sep. 16, 2010

(65) Prior Publication Data
US 2012/0069471 A1 Mar. 22, 2012

(51) Int. Cl.
*G11B 5/39* (2006.01)
(52) U.S. Cl.
USPC ................... 360/324.11; 360/319
(58) Field of Classification Search
USPC ................... 360/319, 324–324.2
See application file for complete search history.

(56) References Cited

U.S. PATENT DOCUMENTS

| | | | |
|---|---|---|---|
| 5,135,588 A * | 8/1992 | Okiyama et al. | 148/327 |
| 5,158,624 A * | 10/1992 | Okiyama et al. | 148/310 |
| 6,495,275 B2 * | 12/2002 | Kamiguchi et al. | 360/324.11 |
| 6,735,058 B2 | 5/2004 | Lin et al. | |
| 6,790,541 B2 | 9/2004 | Saito et al. | |
| 6,819,532 B2 | 11/2004 | Kamijo | |
| 7,331,100 B2 | 2/2008 | Li et al. | |
| 7,352,543 B2 | 4/2008 | Li et al. | |
| 7,362,546 B2 | 4/2008 | Hasegawa et al. | |
| 7,606,007 B2 | 10/2009 | Gill | |
| 8,164,862 B2 * | 4/2012 | Zhang et al. | 360/324.1 |
| 8,169,753 B2 * | 5/2012 | Lin | 360/324.12 |
| 8,451,566 B2 | 5/2013 | Lin | |
| 2002/0009616 A1 * | 1/2002 | Kamiguchi et al. | 428/692 |
| 2005/0185454 A1 * | 8/2005 | Brown et al. | 365/171 |
| 2006/0180839 A1 * | 8/2006 | Fukumoto et al. | 257/295 |
| 2007/0146928 A1 | 6/2007 | Zhang et al. | |
| 2007/0211392 A1 | 9/2007 | Zeltser | |

(Continued)

FOREIGN PATENT DOCUMENTS

JP 2007/26481 A2 2/2007
JP 2009-252342 A 10/2009

OTHER PUBLICATIONS

U.S. Appl. No. 12/884,100, filed Sep. 16, 2010.
Lenssen et al., "Structure and Sensor Properties of a Robust GMR Material System," Mat. Res. Soc. Symp. Proc. vol. 562, © 1999 Materials Research Society, p. 33-44.

(Continued)

*Primary Examiner* — Will J Klimowicz
(74) *Attorney, Agent, or Firm* — Zilka-Kotab, PC

(57) ABSTRACT

A current-perpendicular-to-plane (CPP) tunneling magnetoresistance (TMR) or giant magnetoresistance (GMR) read sensor with ferromagnetic buffer, shielding and seed layers is proposed for high-resolution magnetic recording. The ferromagnetic buffer layer is preferably formed of an amorphous Co—X (where X is Hf, Y, Zr, etc.) film. It provides the CPP read sensor with microstructural discontinuity from a ferromagnetic lower shield, thus facilitating the CPP read sensor to grow freely with preferred crystalline textures, and with ferromagnetic continuity to the ferromagnetic lower shield, thus acting as a portion of the ferromagnetic lower shield. The ferromagnetic shielding layer is preferably formed of a polycrystalline Ni—Fe film. It exhibits magnetic properties exactly identical to those of the ferromagnetic lower shield, thus acting identically as the ferromagnetic lower shield, and a uniform columnar grain morphology, thus initiating a uniform large grain morphology in the CPP read sensor.

21 Claims, 23 Drawing Sheets

(56) References Cited

U.S. PATENT DOCUMENTS

| | | | |
|---|---|---|---|
| 2007/0230067 A1* | 10/2007 | Jogo et al. | 360/324.1 |
| 2008/0137236 A1 | 6/2008 | Lee et al. | |
| 2008/0151442 A1 | 6/2008 | Mauri et al. | |
| 2009/0046395 A1 | 2/2009 | Maehara et al. | |
| 2009/0161268 A1 | 6/2009 | Lin | |
| 2009/0168267 A1 | 7/2009 | Lin | |
| 2009/0174968 A1 | 7/2009 | Singleton et al. | |
| 2009/0251829 A1* | 10/2009 | Zhang et al. | 360/319 |
| 2010/0128400 A1* | 5/2010 | Lin | 360/319 |
| 2012/0069471 A1 | 3/2012 | Lin | |
| 2012/0069472 A1* | 3/2012 | Lin | 360/123.37 |
| 2012/0164485 A1* | 6/2012 | Lin | 428/811.3 |

OTHER PUBLICATIONS

Selte et al., "Equiatomic Transition Metal Alloys of Manganese; VII. A Neutron Diffraction Study of Magnetic Ordering in the IrMn Phase," Acta Chemica Scandinavica vol. 22, No. 9, 1968, p. 3039-3042.

Brun et al., "Equiatomic Transition Metal Alloys of Manganese: II. The Tetragonal IrMn Phase," Acta Chemica Scandinavica vol. 19, No. 1, 1965, p. 107-112.

Restriction/Election Requirement from U.S. Appl. No. 12/884,100 dated Aug. 20, 2012.

Non-Final Office Action Summary from U.S. Appl. No. 12/884,100 dated Oct. 23, 2012.

\* cited by examiner

CURRENT-PERPENDICULAR-TO-PLANE (CPP) READ SENSOR WITH FERROMAGNETIC BUFFER, SHIELDING AND SEED LAYERS

RELATED APPLICATIONS

The present Application is related to commonly assigned U.S. patent application entitled, CURRENT-PERPENDICULAR-TO-PLANE (CPP) READ SENSOR WITH FERROMAGNETIC BUFFER AND SEED LAYERS, Ser. No. 12/884,100, now U.S. Pat. No. 8,451,566, which is incorporated herein by reference.

FIELD OF THE INVENTION

The invention relates to non-volatile magnetic storage devices and more particularly to a magnetic disk drive including a current-perpendicular-to-plane (CPP) tunneling magnetoresistance (TMR) or giant magnetoresistance (GMR) read sensor with ferromagnetic buffer, shielding and seed layers for high-resolution magnetic recording.

BACKGROUND OF THE INVENTION

One of many extensively used non-volatile magnetic storage devices is a magnetic disk drive. The magnetic disk drive includes a rotatable magnetic disk and an assembly of write and read heads. The assembly of write and read heads is supported by a slider that is mounted on a suspension arm. The suspension arm is supported by an actuator that can swing the suspension arm to place the slider with its air bearing surface (ABS) over the surface of the magnetic disk.

When the magnetic disk rotates, an air flow generated by the rotation of the magnetic disk causes the slider to fly on a cushion of air at a very low elevation (fly height) over the magnetic disk. When the slider rides on the air, the actuator moves the suspension arm to position the assembly of the write and read heads over selected data tracks on the magnetic disk. The write and read heads write and read data on the magnetic disk. Processing circuitry connected to the assembly of the write and read heads then operates according to a computer program to implement writing and reading functions.

The write head includes a magnetic write pole and a magnetic return pole, which are magnetically connected with each other at a region away from the ABS, and are surrounded by an electrically conductive write coil. In a writing process, the electrically conductive write coil induces a magnetic flux in the write and return poles. This results in a magnetic write field that is emitted from the write pole to the magnetic disk in a direction perpendicular to the surface of the magnetic disk. The magnetic write field writes data on the magnetic disk, and then returns to the return pole so that it will not erase previously written data tracks.

The read head includes a read sensor which is electrically connected with ferromagnetic lower and upper shields, but is electrically separated by insulation layers from longitudinal bias layers in two side regions. In a reading process, the read head passes over magnetic transitions of a data track on the magnetic disk, and magnetic fields emitting from the magnetic transitions modulate the resistance of the read sensor in the read head. Changes in the resistance of the read sensor are detected by a sense current passing through the read sensor, and are then converted into voltage changes that generate read signals. The resulting read signals are used to decode data encoded in the magnetic transitions of the data track.

A current-perpendicular-to-plane (CPP) tunneling magnetoresistance (TMR) or giant magnetoresistance (GMR) read sensor is typically used in the read head. The CPP TMR read sensor includes a nonmagnetic insulating barrier layer sandwiched between a ferromagnetic reference layer and a ferromagnetic sense layer, and the CPP GMR read sensor includes a nonmagnetic conducting spacer layer sandwiched between the ferromagnetic reference and sense layers. The thickness of the barrier or spacer layer is chosen to be less than the mean free path of conduction electrons passing through the CPP TMR or GMR read sensor. The magnetization of the reference layer is pinned in a direction perpendicular to the ABS, while the magnetization of the sense layer is oriented in a direction parallel to the ABS. When passing the sense current through the CPP TMR or GMR read sensor, the conduction electrons are scattered at lower and upper surfaces of the barrier or spacer layer. When receiving magnetic fields emitting from the magnetic transitions of the data track on the magnetic disk, the magnetization of the reference layer remains pinned while that of the sense layer rotates. Scattering decreases as the magnetization of the sense layer rotates towards that of the reference layer, but increases as the magnetization of the sense layer rotates away from that of the reference layer. These scattering variations lead to changes in the resistance of the CPP TMR or GMR read sensor in proportion to the magnitudes of the magnetic fields and $\cos \theta$, where $\theta$ is an angle between the magnetizations of the reference and sense layers. The changes in the resistance of the CPP TMR or GMR read sensor are then detected by the sense current and converted into voltage changes that are detected and processed as read signals.

The CPP TMR read sensor has been progressively miniaturized for magnetic recording at higher linear and track densities. Its thickness, which defines a read gap, is reduced by utilizing thinner reference, barrier, sense or other layers, in order to increase linear densities. Its width, which defines a track width, is reduced by patterning with an advanced photolithographic tool, in order to increase track densities. Further decreases in the thickness and width of the CPP TMR read sensor are desired in order to further increase the linear and track densities, respectively.

SUMMARY OF THE INVENTION

The invention provides a current-perpendicular-to-plane (CPP) tunneling magnetoresistance (TMR) or giant magnetoresistance (GMR) read sensor with ferromagnetic buffer, shielding and seed layers.

The ferromagnetic buffer layer is preferably formed of an amorphous Co—X (where X is Hf, Y, Zr, etc.) film. It provides the CPP read sensor with microstructural discontinuity from a ferromagnetic lower shield, thus facilitating the CPP read sensor to grow freely with preferred crystalline textures, but with ferromagnetic continuity to the ferromagnetic lower shield, thus acting as a portion of the ferromagnetic lower shield.

The ferromagnetic shielding layer is preferably formed of a polycrystalline Ni—Fe film. It exhibits magnetic properties exactly identical to those of the ferromagnetic lower shield, thus acting identically as the ferromagnetic lower shield. It also exhibits a uniform columnar grain morphology distinctly different from a non-uniform equal-axial grain morphology in the ferromagnetic lower shield, thus initiating a uniform large grain morphology in the CPP read sensor and facilitating the CPP read sensor to exhibit a low $R_J A_J$.

The ferromagnetic seed layer is preferably formed of a polycrystalline Ni—X (where X is Pt, Pd, Rh, Ru, etc.) film that exhibits a face-centered-cubic (fcc) structure and does not exchange-couple with the antiferromagnetic pinning layer. It provides the CPP read sensor with microstructural continuity, thus facilitating the CPP read sensor to develop preferred crystalline textures and exhibit good magnetic and TMR properties, and with ferromagnetic continuity to the ferromagnetic lower shield, thus also acting as another portion of the ferromagnetic lower shield and defining the lower bound of a read gap with its upper surface.

These and other features and advantages of the invention will be apparent upon reading of the following detailed description of preferred and alternative embodiments taken in conjunction with the Figures in which like reference numerals indicate like elements throughout.

BRIEF DESCRIPTION OF THE DRAWINGS

For a fuller understanding of the nature and advantages of the invention, as well as the preferred mode of use, reference should be made to the following detailed description read in conjunction with the accompanying drawings which are not to scale.

Table 1 is a table summarizing $H_{CE}$, $H_{UA}$, $J_K$ and $T_S$ determined from easy-axis magnetic and resistance responses of Ir—Mn/Co—Fe films with various buffer and seed layers before and after baking at $T_B$ in accordance with a prior art.

Table 2 is a table summarizing $H'_{CE}$, $H'_{UA}$, $J'_K$, $H_{CE}$, $H_{UA}$, $J_K$ and $T_S$ determined from easy-axis magnetic and resistance responses of Ir—Mn/Co—Fe films with various buffer and seed layers before and after baking at $T_B$ in accordance with a preferred embodiment of the invention.

Table 3 is a table summarizing $H_C$, $H_F$, $H_{SF}$, $H'_{SF}$, $R_J A_J$ and $\Delta R_T/R_J$ determined from from easy-axis magnetic and resistance responses of CPP TMR read sensors with various buffer and seed layers after annealing for 5 hours at 280° C. in accordance with prior arts and a preferred embodiment of the invention.

Table 4 is a table summarizes $H_C$, $H_F$, $H_{SF}$, $H'_{SF}$, $R_J A_J$ and $\Delta R_T/R_J$ determined from easy-axis magnetic and resistance responses of CPP TMR read sensors with various buffer, shielding and seed layers after annealing for 5 hours at 280° C. in accordance with prior arts, preferred and alternative embodiments of the invention.

DETAILED DESCRIPTION OF THE EMBODIMENTS

The following description is of the best embodiments presently contemplated for carrying out the invention. This description is made for the purpose of illustrating the general principles of the invention and is not meant to limit the inventive concepts claimed herein.

Figure 1:
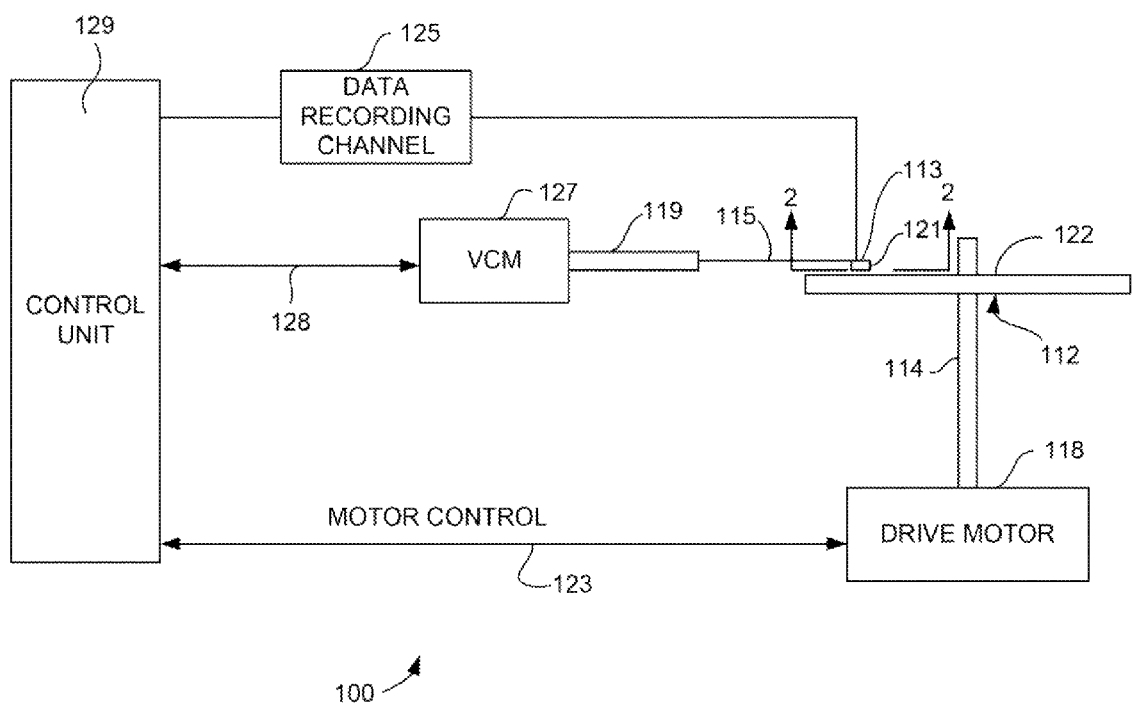
FIG. 1 is a schematic illustration of a magnetic disk drive in which the invention is embodied.

Referring now to FIG. 1, there is shown a magnetic disk drive 100 embodying the invention. As shown in FIG. 1, at least one rotatable magnetic disk 112 is supported on a spindle 114 and rotated by a disk drive motor 118. Magnetic recording on each magnetic disk 112 is performed at annular patterns of data tracks (not shown) on the magnetic disk 112.

At least one slider 113 is positioned near the magnetic disk 112, each slider 113 supporting one assembly of write and read heads 121. As the magnetic disk 112 rotates, the slider 113 moves radially in and out over the disk surface 122 so that the assembly of the write and read heads 121 may access different data tracks (not shown) on the magnetic disk 112. Each slider 113 is mounted on a suspension arm 115 that is supported by an actuator 119. The suspension arm 115 provides a slight spring force which biases the slider 113 against the disk surface 122. Each actuator 119 is attached to an actuator means 127 that may be a voice coil motor (VCM). The VCM comprises a coil movable within a fixed magnetic field, the direction and speed of the coil movements being controlled by the motor current signals supplied by a control unit 129.

During operation of the magnetic disk drive 100, the rotation of the magnetic disk 112 generates an air bearing between the slider 113 and the disk surface 122, which exerts an upward force or lift on the slider 113. The air bearing thus counter-balances the slight spring force of the suspension arm 115 and supports the slider 113 off and slightly above the disk surface 122 by a small, substantially constant spacing during sensor operation.

The various components of the magnetic disk drive 100 are controlled in operation by control signals generated by the control unit 129, such as access control signals and internal clock signals. Typically, the control unit 129 comprises logic control circuits, storage means and a microprocessor. The control unit 129 generates control signals to control various system operations such as drive motor control signals on line 123, and head position and seek control signals on line 128. The control signals on line 128 provide the desired current profiles to optimally move and position the slider 113 to the desired data track (not shown) on the magnetic disk 112. Write and read signals are communicated to and from, respectively, the assembly of the write and read heads 121 by way of a data recording channel 125.

Figure 2:
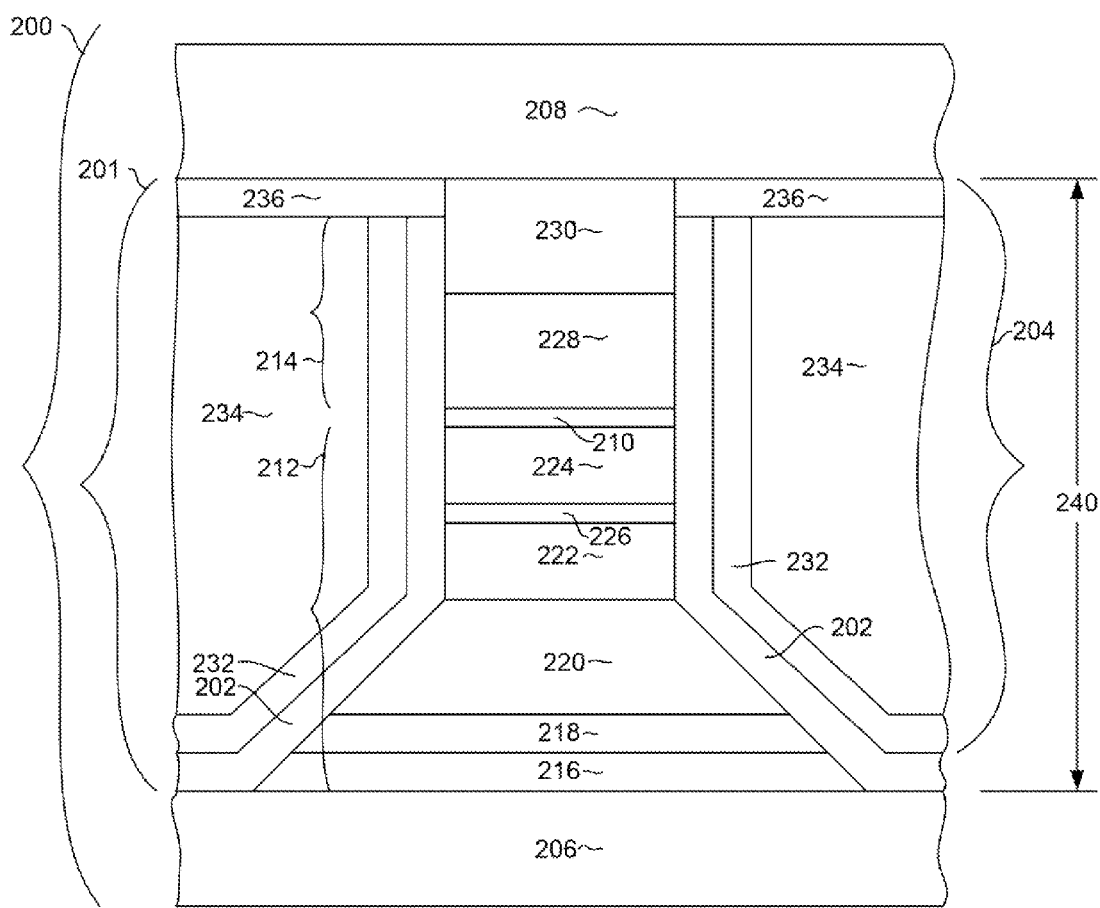
FIG. 2 is an ABS schematic view of a read head in accordance with a prior art.

In a read head 200 in accordance with a prior art, as shown in FIG. 2, a current-perpendicular-to-plane (CPP) tunneling magnetoresistance (TMR) or giant magnetoresistance (GMR) read sensor 201 is electrically connected with ferromagnetic lower and upper shields 206, 208 for allowing the sense current to flow in a direction perpendicular to planes of the CPP TMR or GMR read sensor 201, but is electrically insulated by insulation layers 202 from longitudinal bias stacks 204 in two side regions for preventing a sense current from shunting through the two side regions.

A typical CPP TMR read sensor 201 includes an electrically insulating barrier layer 210 sandwiched between lower and upper sensor stacks 212, 214. The barrier layer 210 is formed of a nonmagnetic oxygen-doped Mg (Mg—O), Mg oxide (MgO), or Mg—O/MgO/Mg—O ($MgO_X$) films having a thickness ranging from 0.4 to 1 nm. When the sense current quantum-jumps across the Mg—O, MgO or $MgO_X$ barrier layer 210, changes in the resistance of the CPP TMR read sensor 201 are detected through a TMR effect.

A typical CPP GMR read sensor 201 includes an electrically conducting spacer layer 210 sandwiched between lower and upper sensor stacks 212, 214. The spacer layer 210 is formed of a nonmagnetic Cu or oxygen-doped Cu (Cu—O) film having a thickness ranging from 1.6 to 4 nm. When the sense current flows across the Cu or Cu—O spacer layer 210, changes in the resistance of the CPP GMR read sensor 201 is detected through a GMR effect.

The lower sensor stack 212 comprises a buffer layer 216 formed of a 2 nm thick nonmagnetic Ta film, a seed layer 218 formed of a 2 nm thick nonmagnetic Ru film, a pinning layer 220 formed of a 6 nm thick antiferromagnetic 23.2Ir-76.8Mn (composition in atomic percent) film, a keeper layer structure 222, an antiparallel-coupling layer 226 formed of a 0.8 nm thick nonmagnetic Ru film, and a reference layer structure 224. The keeper layer structure 222 comprises a first keeper layer formed of a 1.6 nm thick 72.5Co-27.5Fe film and a second keeper layer formed of a 0.6 nm thick 64.1Co-35.9Fe film. The thickness of the keeper layer structure 222 is selected in order to attain a saturation moment of 0.32 memu/$cm^2$ (corresponding to that of a 4.6 nm thick ferromagnetic 88Ni-12Fe film sandwiched into two Cu films). The reference layer structure 224 comprises a first reference layer formed of a 0.6 nm thick 64.1Co-35.9Fe film, a second reference layer formed of a 0.6 nm thick 75.5Co-24.5Hf film, a third reference layer formed of a 1.2 nm thick 65.5Co-19.9Fe-14.6B film, and a fourth reference layer formed of a 0.3 nm thick 46.8Co-53.2 Fe film. The thickness of the reference layer structure 224 is selected in order to attain a saturation moment of 0.30 memu/$cm^2$ (corresponding to that of a 4.3 nm thick ferromagnetic 88Ni-12Fe film sandwiched into two Cu films).

The upper sensor stack 214 comprises a sense layer structure 228 and a cap layer structure 230. The sense layer structure 228 comprises a first sense layer formed of a 0.4 nm thick ferromagnetic 87.5Co-12.5Fe film, a second sense layer formed of a 1.6 nm thick ferromagnetic 79.3Co-4.0Fe-16.7B film, and a third sense layer formed of a 2.8 nm thick ferromagnetic 87.1Co-12.9Hf film. The thickness of the sense layer structure 228 is selected in order to attain a saturation moment of 0.42 memu/$cm^2$ (corresponding to that of a 6 nm thick ferromagnetic 88Ni-12Fe film sandwiched into two Cu films). The cap layer structure 230 comprises a first cap layer formed of a 2 nm thick nonmagnetic Ru film, a second cap layer formed of a 2 nm thick nonmagnetic Ta film, and a third cap layer formed of a 4 nm thick nonmagnetic Ru film.

A typical insulation layer 202 in each side region is formed of a 3 nm thick nonmagnetic, amorphous $Al_2O_3$ film. A typical longitudinal bias stack 204 in each side region comprises a seed layer 232 formed of a 4 nm thick nonmagnetic Cr film, a longitudinal bias layer 234 formed of a 24 nm thick hard-magnetic 82Co-18Pt film, and a cap layer 236 formed of a 10 nm thick nonmagnetic Cr film. The thickness of the Co—Pt longitudinal layer 234 is selected in order to attain a remnant moment of 2.1 memu/$cm^2$ (corresponding to that of a 30 nm thick ferromagnetic 88Ni-12Fe film sandwiched between two Cu films).

In the fabrication process of the read head 200, the CPP TMR or GMR read sensor 201 is deposited on a wafer with a ferromagnetic lower shield 206 formed of a 1 μm thick ferromagnetic 80Ni-20Fe film in a sputtering system, and is annealed in a magnetic field of 50,000 Oe for 5 hours at 280° C. in a high-vacuum oven. The CPP TMR or GMR read sensor 201 is patterned in a photolithographic process to produce sensor front and rear edges, and then patterned again in another photographic process to produce sensor tails at the two side regions. The $Al_2O_3$ insulation layer 202 and the longitudinal bias stack 204 are then deposited into the two side regions. The photoresist is then removed and a chemical-mechanical-polishing process is conducted. The CPP TMR or GMR read sensor 201, the $Al_2O_3$ insulation layer 202, and the longitudinal bias stack 204 are then covered by a ferromagnetic upper shield 208 also formed of a 1 μm thick ferromagnetic 80Ni-20Fe film, and by a gap formed of a 100 nm thick ferromagnetic $Al_2O_3$ film. A read gap 240 is defined by the thickness of the CPP TMR or TMR read sensor 201, or a distance between the ferromagnetic lower shield 206 and a ferromagnetic upper shield 208. After completing the read head fabrication process, the write head fabrication process starts.

The keeper layer structure 222, the antiparallel-coupling layer 226 and the reference layer structure 224 form a flux closure where several magnetic interactions occur. First, antiferromagnetic/ferromagnetic coupling occurs between the pinning layer 220 and the keeper layer structure 222, increasing the easy-axis coercivity ($H_{CE}$) of the keeper layer structure 222 and inducing a unidirectional anisotropy field ($H_{UA}$). Second, ferromagnetic/ferromagnetic coupling occurs across the antiparallel-coupling layer 226 and between the keeper layer structure 222 and the reference layer structure 224, inducing a bidirectional anisotropy field ($H_{BA}$). Third, another ferromagnetic/ferromagnetic coupling occurs across the barrier layer 210 and between the reference structure 224 and the sense layer structure 228, increasing the easy-axis coercivity ($H_C$) of the sense layer structure 228 and inducing a ferromagnetic-coupling field ($H_F$). Fourth, magnetostatic interaction occurs in the sense layer structure 228 due to stray fields stemming from the net magnetization of the keeper layer structure 222 and the reference layer structure 224, inducing a demagnetizing field ($H_D$). To ensure proper sensor operation, $H_{UA}$ and $H_{BA}$ must be high enough to rigidly pin the magnetizations of the keeper layer structure 222 and the reference layer structure 224 in opposite transverse directions perpendicular to the ABS, while $H_F$ and $H_D$ must be small and balance with each other to orient the magnetization of the sense layer structure 228 in a longitudinal direction parallel to the ABS.

When a sense current flows in a direction perpendicular to planes of the CPP TMR read sensor 201, the CPP TMR read sensor 201 acts as a series circuit. Since the Mg—O, MgO or $MgO_X$ barrier layer 210 exhibits an electrical resistivity higher than $1 \times 10^5$ μΩ-cm while all the other metallic layers lower than 200 μΩ-cm, it acts as the highest-resistance path in the series circuit. The areal resistance of the CPP TMR read sensor 201 can thus be characterized by a product of junction resistance and area ($R_J A_J$). When the sense current quantum-jumps across the barrier layer 210 and a magnetic field rotates the magnetization of the sense layer structure 228 from the same direction as that of the reference layer structure 224 to an opposite direction, coherent scattering of conduction electrons at lower and upper surfaces of the barrier layer 210 induces a TMR effect and causes an increase in the electrical resistance from $R_J$ to $R_J + \Delta R_T$. The strength of this TMR effect can be characterized by a TMR coefficient ($\Delta R_T / R_J$).

Since the Ta buffer layer 216 is nonmagnetic, it acts as a portion of the read gap, and its lower surface thus defines the lower bound of the read gap. Since the Ta buffer layer 216 exhibits a body-centered-cubic (bcc) structure while the Ni—Fe lower shield 206 a face-centered-cubic (fcc) structure, the Ta buffer layer 216 reduces microstructural effects of the Ni—Fe lower shield 206 on the CPP TMR read sensor 201.

Since the Ru seed layer 218 exhibits a hexagonal-closed-packed (hcp) structure (which is formed of two types of closest-packed monolayers) distinctly different from the bcc structure, the Ru seed layer 218 grows with crystalline textures affected by the Ta buffer layer 216. Since the Ir—Mn pinning layer 220 exhibits an fcc structure (which is formed of three types of closest-packed monolayers similar to the hcp structure, the Ru seed layer 218 develops an epitaxial relationship with the Ir—Mn pinning layer 220, and thus facilitates the Ir—Mn pinning layer 220 to grow with preferred crystalline textures needed for high $H_{UA}$.

Figure 3:
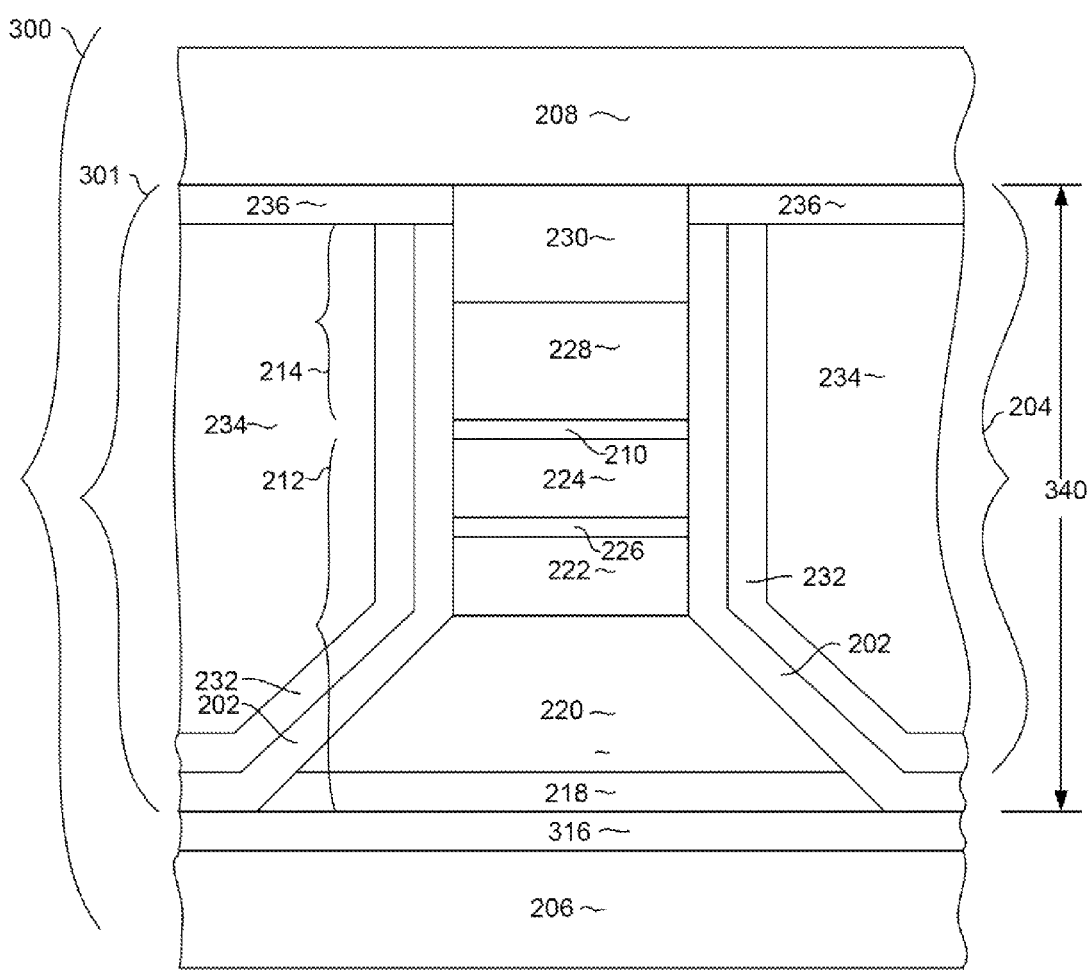
FIG. 3 is an ABS schematic view of a read head in accordance with another prior art.

FIG. 3 illustrates an ABS view of another read head 300 in accordance with the prior art, which is similar to the read head 200 except that the buffer layer 316 of the CPP TMR read sensor 301 is formed of a 2 nm thick ferromagnetic 76.2Co-23.8Hf film, and is extended from the read region into the two side regions. Since the Co—Hf buffer layer 316 is ferromagnetic, it acts as a portion of the Ni—Fe lower shield 206, and its upper surface thus defines the lower bound of the read gap 340. Since the Co—Hf buffer layer 316 is amorphous, it eliminates microstructural effects of the Ni—Fe lower shield 206 on the CPP TMR read sensor 301, and establishes a fresh foundation for the Ru seed layer 218 to grow freely with its own preferred crystalline textures and develop the epitaxial relationship with the Ir—Mn pinning layer 220.

As shown in FIG. 3, by replacing the nonmagnetic Ta buffer layer 216 with the ferromagnetic Co—Hf buffer layer 316, the read gap decreases by 2 nm. To apply this approach to the CPP TMR read sensor 301, it is crucial to ensure that this replacement will not deteriorate its magnetic properties (i.e., $H_{CE}$, $H_{UA}$, $H_{BA}$, $H_C$, $H_F$, etc.) and TMR properties (i.e., $R_J A_J$, $\Delta R_T / R_J$, etc.) before and after sensor operation at elevated temperatures. The feasibility of this approach is assessed as described below.

A buffer layer formed of a 2 nm thick Ta, 75.5Co-24.5Hf or 65.5Co-19.9Fe-14.6B film, a seed layer formed of a 2 nm thick Ru or Pt film, a pinning layer 220 formed of a 6 nm thick antiferromagnetic 21.7Ir-78.3Mn film, a keeper layer 222 formed of a 3.6 nm thick ferromagnetic 77.5Co-22.5Fe film with a saturation of 0.56 memu/cm² (corresponding to that of a 8 nm thick ferromagnetic 88Ni-12Fe film sandwiched into two Cu films), and a cap layer structure formed of Ru(2)/Ta (2)/Ru(4) films are sequentially deposited on a bare glass substrate and annealed for 5 hours at 280° C. in a magnetic field of 50,000 Oe. Magnetic responses of the films are then detected with a vibrating sample magnetometer (VSM) by applying a magnetic field to the films in a direction parallel or antiparallel to the easy axis of the Co—Fe keeper layer 222, in order to determine $H_{CE}$ and $H_{UA}$.

The films are then baked for 5 minutes at a series of baking temperatures ($T_B$) in a magnetic field of 5,000 Oe antiparallel to the easy axis of the Co—Fe keeper layer 222, in order to simulate a disk drive environment where the CPP TMR read sensor operates. Resistance responses of the films are then detected with a four-point probe by applying a sense current to the films in a direction perpendicular to the easy axis of the Co—Fe keeper layer 222 and a magnetic field to the films in a direction parallel or antiparallel to the easy axis, in order to determine $H_{CE}$ and $H_{UA}$ after sensor operation at various $T_B$ in the simulated disk drive environment.

Figure 4:
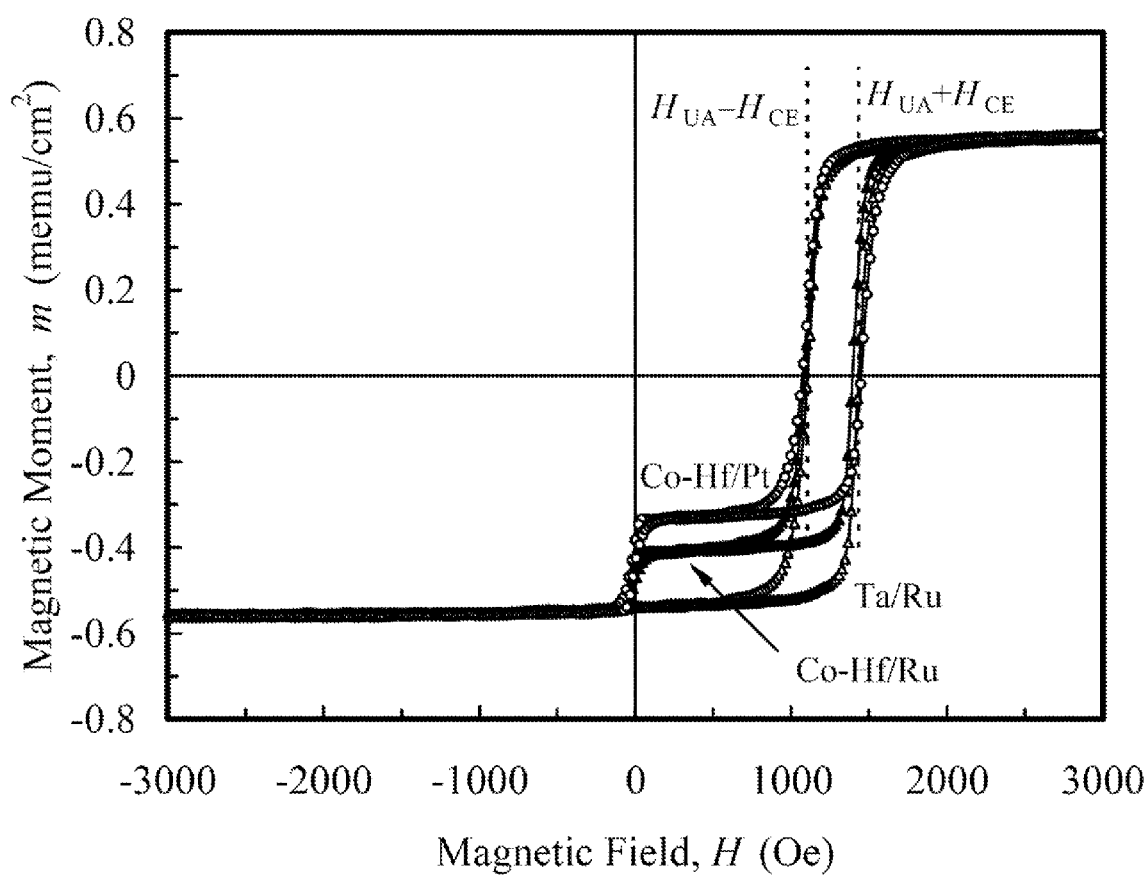
FIG. 4 is a chart showing easy-axis magnetic responses of Ir—Mn/Co—Fe films with various buffer and seed layers after annealing for 5 hours at 280° C.

FIG. 4 shows easy-axis magnetic responses of the Ir—Mn/Co—Fe films with various buffer and seed layers after annealing for 5 hours at 280° C. Two types of hysteresis loops are identified, one centered and the other shifted. The centered hysteresis loop originates from easy-axis magnetic responses of the ferromagnetic Co—Hf buffer layer 316 that is exchange-decoupled by the nonmagnetic Ru or Pt seed layer 218 from the antiferromagnetic Ir—Mn pinning layer 220. Due to this exchange decoupling, the ferromagnetic Co—Hf buffer layer 316 can act freely as a portion of the ferromagnetic Ni—Fe lower shield 206. In addition, the centered hysteresis loops reveal that the saturation magnetic moments of the Co—Hf buffer layer 316 beneath the Ru and Pt seed layers 218 are 0.08 and 0.14 memu/cm², respectively. The moment loss at an interface between the Co—Hf buffer layer 316 and the Ru seed layer 218 appears much larger than that at an interface between the Co—Hf buffer layer 316 and the Pt seed layer 218.

On the other hand, the shifted hysteresis loop originates from easy-axis magnetic responses of the ferromagnetic Co—Fe keeper layer 222 that exchange-couples with the antiferromagnetic Ir—Mn pinning layer 220. As the magnetic field antiparallel to the easy axis of the Co—Fe keeper layer 222 increases to $H_{UA}+H_{CE}$, it rotates the magnetization of the Co—Fe keeper layer 222 by 180° to the field direction and thus the magnetic moment of the Co—Fe keeper layer 222 increases from minimal to maximal values. As the antiparallel magnetic field decreases to $H_{UA}-H_{CE}$, the magnetization of the Co—Fe keeper layer 222 becomes free and rotates to its original direction, and thus the magnetic moment decreases from maximal to minimal values. As a result, a shifted hysteresis loop is formed, and the antiferromagnetic/ferromagnetic coupling occurring between the Ir—Mn pinning layer 220 and the Co—Fe keeper layer 222 is confirmed. The half width and the shift of the shifted hysteresis loop thus determine $H_{CE}$ and $H_{UA}$, respectively. The extrinsic strength of the antiferromagnetic/ferromagnetic coupling, which is expressed by $H_{UA}$, can be converted into an intrinsic strength by defining an antiferromagnetic/ferromagnetic coupling energy ($J_K$), which is a product of a saturation magnetization ($M_S$), the Co—Fe keeper-layer thickness ($\delta_{CF}$) and $H_{UA}$. $H_{CE}$ values of the Ir—Mn/Co—Fe films with Ta buffer/Ru seed, Co—Hf buffer/Ru seed and Co—Hf buffer/Pt seed layers are determined from FIG. 4 to be 163.9, 145.5 and 179.8 Oe, respectively, and $H_{UA}$ values 1,269, 1,256 and 1,288 Oe, respectively (corresponding to $J_K$ values of 0.707, 0.694 and 0.724 erg/cm², respectively).

Figure 5:
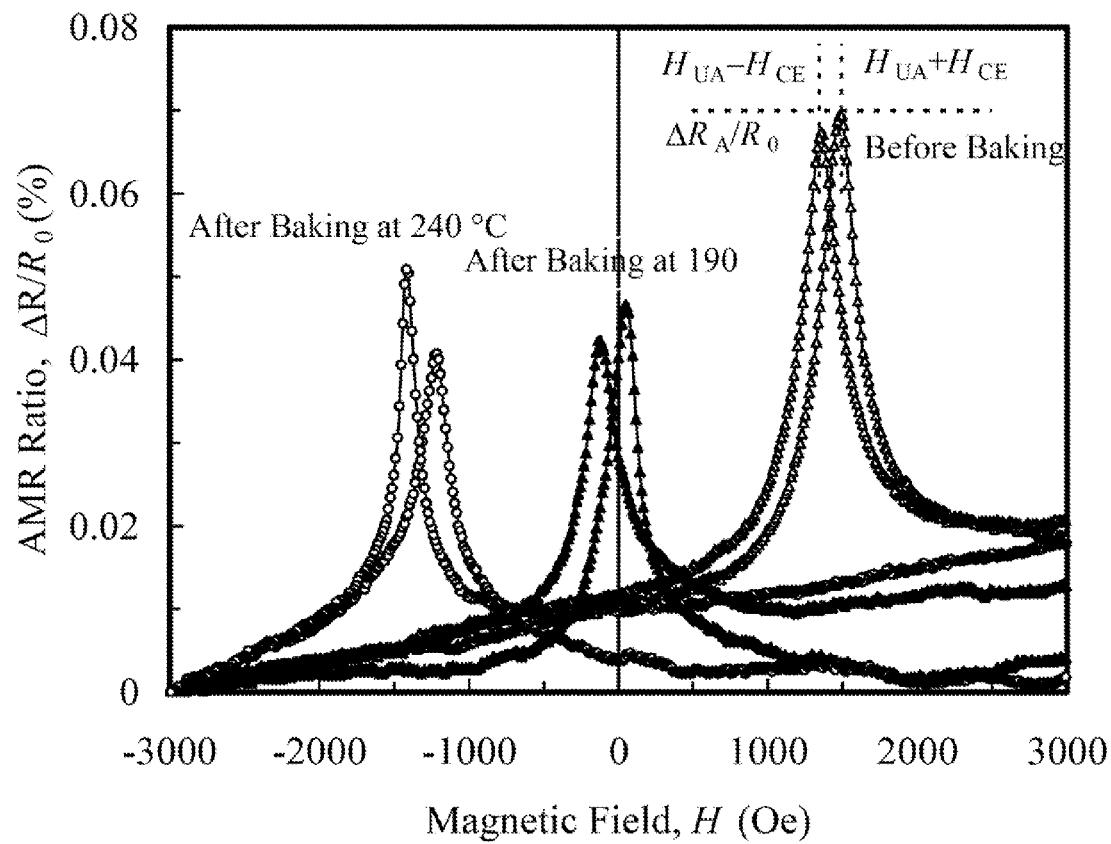
FIG. 5 is a chart showing easy-axis resistance responses of Ir—Mn/Co—Fe films with various buffer and seed layers before baking and after baking at 190 and 240° C.

FIG. 5 shows easy-axis resistance responses of the Ir—Mn/Co—Fe films with various buffer and seed layers before and after baking at 190 and 240° C. Due to an anisotropy magnetoresistance (AMR) effect, the resistance varies in proportion to the magnitude of the magnetic field and $\cos^2 \theta'$, where $\theta'$ is an angle between the sense current and the magnetization of the Co—Fe keeper layer 222. When a magnetic field rotates the magnetization of the Co—Fe keeper layer 222 from a direction perpendicular to the sense current by 90° to another direction parallel or antiparallel to the sense current, the AMR effect occurs and causes an increase in the electrical resistance from a minimal value ($R_0$) to a maximal value ($R_0+\Delta R_A$). The strength of this AMR effect can thus be characterized by an AMR coefficient ($\Delta R_A/R_0$).

As the antiparallel magnetic field increases to $H_{UA}+H_{CE}$, it rotates the magnetization of the Co—Fe keeper layer 222 by 180° to the field direction. During this magnetization rotation, the resistance of the films increases from $R_0$ when the magnetization is perpendicular to the sense current, to $R_0+\Delta R_A$ when the magnetization is parallel or antiparallel to the sense current, and then to $R_0$ again when the magnetization is perpendicular to the sense current again. On the other hand, as the antiparallel magnetic field decreases to $H_{UA}-H_{CE}$, the magnetization of the Co—Fe keeper layer 222 becomes free and rotates to its original direction. During this magnetization rotation, the resistance of the films increases from $R_0$ when the magnetization is perpendicular to the sense current, to $R_0+\Delta R_A$ when the magnetization is parallel or antiparallel to the sense current, and then to $R_0$ again when the magnetization is perpendicular to the sense current again. As a result, two peaks exhibiting $R_0+\Delta R_A$ are formed, and the antiferromagnetic/ferromagnetic coupling occurring between the Ir—Mn pinning layer 220 and the Co—Fe keeper layer 222 is confirmed. The half of a distance and the shift of a midpoint between the two peaks thus define $H_{CE}$ and $H_{UA}$, respectively.

In spite of $\Delta R_0/R_1$ as low as below 0.07%, the two peaks can be clearly observed, and $H_{CE}$ and $H_{UA}$ can be precisely defined. Since the resistance measurement is much faster than the magnetic measurement, this method appears more effective when conducting a long series of measurements.

Figure 6:
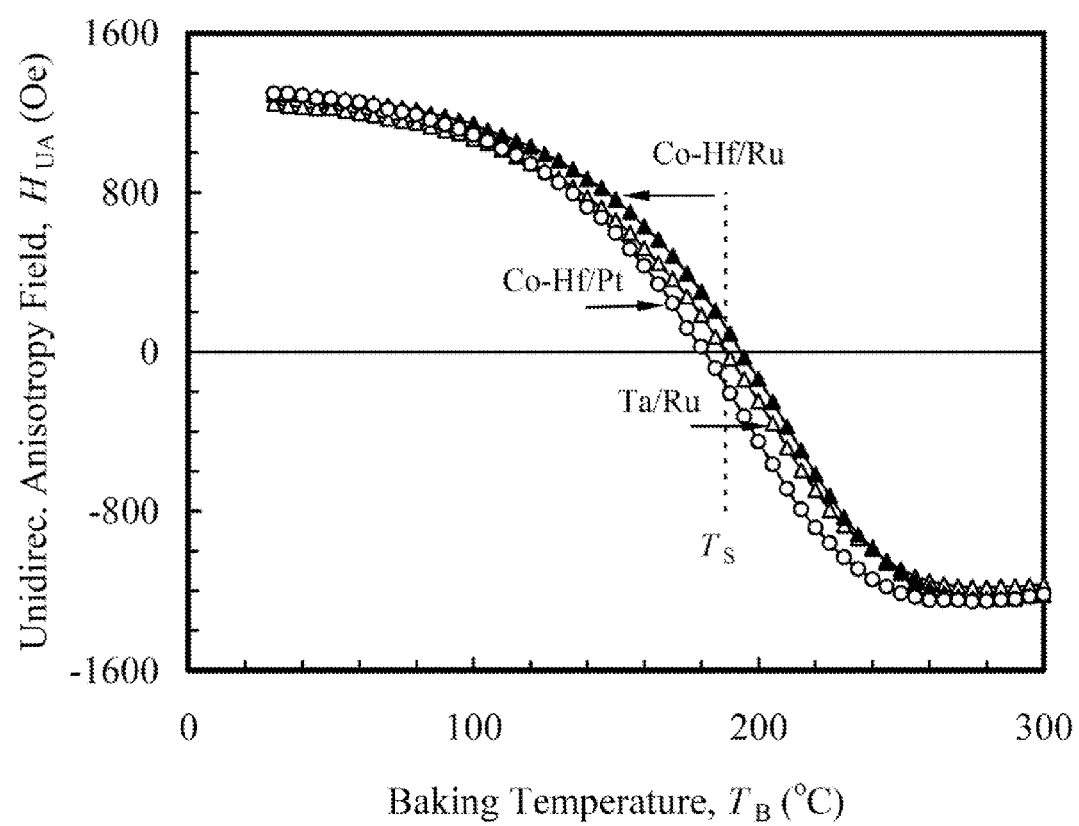
FIG. 6 is a chart showing $H_{UA}$ determined from easy-axis resistance responses versus $T_B$ for Ir—Mn/Co—Fe films with various buffer and seed layers before and after baking at $T_B$.

FIG. 6 shows $H_{UA}$ determined from the easy-axis resistance responses versus $T_B$ for the Ir—Mn/Co—Fe films with various buffer and seed layers before and after baking at $T_B$. As $T_B$ increases, $H_{UA}$ decreases from a maximum value to zero, and then to a minimal value. This phenomenon can be explained by an antiferromagnetic/ferromagnetic coupling model, where an ensemble of various local exchange couples exist at an interface between antiferromagnetic and ferromagnetic films, and each exchange couple exhibits its own local blocking temperature at which an antiparallel field will switch its magnetization by 180° towards the magnetic field. A critical temperature, at which the antiparallel field has switched the magnetizations of 50% of the exchange couples, is defined as a switch temperature ($T_S$). A higher $T_S$ thus indicates more robust thermal stability. $T_S$ values of the Ir—Mn/Co—Fe films with Ta buffer/Ru seed, Co—Hf buffer/Ru seed and Co—Hf buffer/Pt seed layers are determined from FIG. 6 to be 189.6, 195.5 and 181.5° C., respectively.

Table 1 summarizes $H_{CE}$, $H_{UA}$, $J_K$ and $T_S$ determined from the easy-axis magnetic and resistance responses of the Ir—Mn/Co—Fe films with various buffer and seed layers before and after baking at $T_B$ in accordance with the prior arts. $J_K$ remains high when the ferromagnetic Co—Hf buffer layer 316 replaces the nonmagnetic Ta buffer layer 216, but substantially decreases when the ferromagnetic Co—Fe—B buffer layer replaces the nonmagnetic Ta buffer layer 216. On the other hand, $T_S$ substantially increases by 7° C. when the ferromagnetic Co—Hf buffer layer 316 replaces the nonmagnetic Ta buffer layer 216, but substantially decreases when the ferromagnetic Co—Fe—B buffer layer replaces the nonmagnetic Ta buffer layer 216 or the nonmagnetic Pt seed layer replaces the nonmagnetic Ru seed layer 218. Therefore, it is feasible to reduce the read gap by 2 nm by replacing the nonmagnetic Ta buffer layer 216 with the ferromagnetic Co—Hf buffer layer 316. It is desirable to further reduce the read gap by 2 nm by further replacing the nonmagnetic Ru seed layer 218 with a ferromagnetic seed layer. In addition to ensuring that this replacement will not deteriorate magnetic and TMR properties of the CPP TMR read sensor before and after sensor operation at elevated temperatures, it is preferable to ensure that the ferromagnetic seed layer will not exchange-couple with the antiferromagnetic Ir—Mn pinning layer 220, and can thus also act freely as a portion of the ferromagnetic Ni—Fe lower shield 206. The ferromagnetic seed layer is explored and proposed in the invention.

TABLE 1

| Ferromagnetic Buffer Layer | Nonmagnetic Seed Layer | $H_{CE}$ (Oe) | $H_{UA}$ (Oe) | $J_K$ (erg/cm²) | $T_S$ (° C.) |
|---|---|---|---|---|---|
| None | Ta(2)/Ru(2) | 163.9 | 1269.4 | 0.707 | 189.6 |
| Co—Hf(2) | Ru(2) | 145.5 | 1255.5 | 0.694 | 195.5 |
| Co—Hf(2) | Pt(2) | 179.8 | 1287.5 | 0.724 | 181.5 |
| Co—Fe—B(2) | Ru(2) | 158.6 | 958.8 | 0.529 | 170.2 |
| Co—Fe—B(2) | Pt(2) | 141.2 | 1186.4 | 0.665 | 172.1 |

Figure 7:
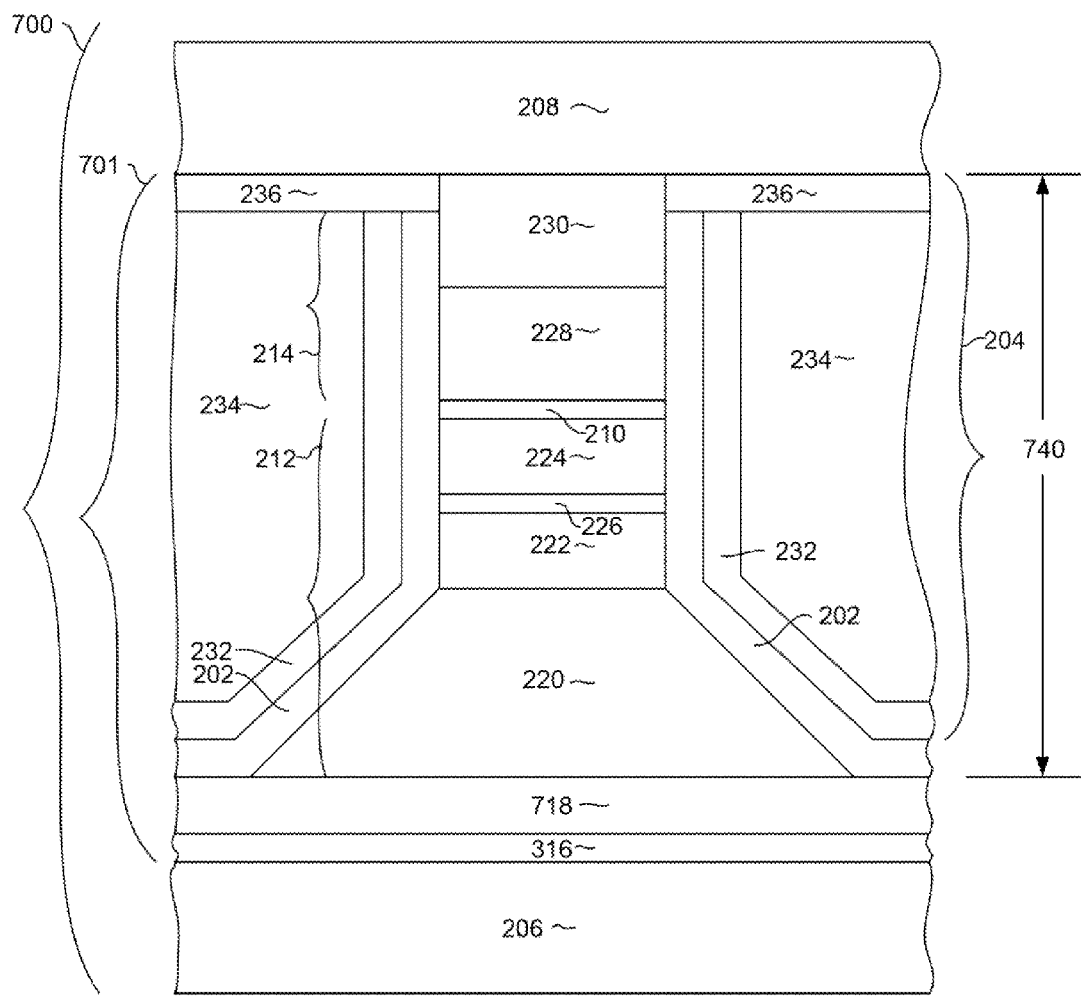
FIG. 7 is an ABS schematic view of a read head in accordance a preferred embodiment of the invention.

FIG. 7 illustrates an ABS view of a read head 700 in accordance with a preferred embodiment of the invention, which is similar to the read head 300 except that the seed layer 718 of the CPP TMR read sensor 701 is formed of a 4 nm thick ferromagnetic 75.2Ni-24.8Pt film, and is extended from the read region into the two side regions. Since the amorphous Co—Hf buffer layer 316 and the Ni—Pt seed layer 718 are all ferromagnetic, they act as portions of the ferromagnetic Ni—Fe lower shield 206, and the upper surface of the Ni—Pt seed layer 718 thus defines the lower bound of the read gap 740. Since the Ni—Pt seed layer 718 exhibits an fcc structure, it grows freely on the amorphous Co—Hf buffer layer 316 and develops its own preferred crystalline textures. Since the Ir—Mn pinning layer 220 also exhibits an fcc structure, the Ni—Pt seed layer 718 develops an epitaxial relationship with the Ir—Mn pinning layer 220, and thus facilitates the Ir—Mn pinning layer 220 to grow with preferred crystalline textures needed for high $H_{UA}$ and high $T_S$.

In the invention, by replacing the nonmagnetic Ta buffer layer 216 with the ferromagnetic Co—Hf buffer layer 316 and replacing the nonmagnetic Ru seed layer 218 with the ferromagnetic Ni—Pt seed layer 718, the read gap 740 decreases by 4 nm. However, ferromagnetic/antiferromagnetic coupling might occur between the Ni—Pt seed layer 718 and the Ir—Mn pinning layer 220, increasing the easy-axis coercivity ($H'_{CE}$) of the Co—Hf buffer layer 316 and the Ni—Pt seed layer 718, and inducing another unidirectional anisotropy field ($H'_{UA}$).

To apply this approach to the CPP TMR read sensor 701, in addition to ensuring that these replacements will not diminish the microstructural effects and thus not deteriorate magnetic properties (i.e., $H_{CE}$, $H_{UA}$, $H_{BA}$, $H_C$, $H_F$, etc.) and TMR properties (i.e., $R_J A_J$, $\Delta R_T/R_J$, etc.), it is also preferable to minimize $H'_{CE}$ and $H'_{UA}$ in order for the Ni—Pt seed layer 718 to freely act as another portion of the Ni—Fe lower shield 206. The feasibility of this approach is assessed as described below.

A buffer layer 316 formed of a 2 nm thick ferromagnetic 75.5Co-24.5Hf film, a seed layer formed of a 4 nm thick ferromagnetic Co, 90.6Co-9.4Fe, Ni, 95.8Ni-4.2Fe, 75.2Ni-24.8Pt or 83.4Ni-3.6Ir-13.0Mn film, a pinning layer 220 formed of a 6 nm thick antiferromagnetic 21.7Ir-78.3Mn film, a keeper layer 222 formed of a 3.6 nm thick ferromagnetic 77.5Co-22.5Fe film with a saturation of 0.56 menu/cm² (corresponding to that of a 8 nm thick ferromagnetic 88Ni-12Fe film sandwiched into two Cu films), and a cap layer structure 230 formed of Ru(2)/Ta(2)/Ru(4) films are sequentially deposited on a bare glass substrate, and annealed for 5 hours at 280° C. in a magnetic field of 50,000 Oe. Magnetic responses of the films are then detected with a VSM by applying a magnetic field to the films in a direction parallel or antiparallel to the easy axis of the Co—Fe keeper layer 222, in order to determine $H'_{CE}$, $H'_{UA}$, $H_{CE}$ and $H_{UA}$.

The films are then baked for 5 minutes at a series of baking temperatures ($T_B$) in a magnetic field of 5,000 Oe antiparallel to the easy axis of the Co—Fe keeper layer 222. Resistance responses of the films are then detected after cooling from $T_B$ to room temperature with a four-point probe by applying a sense current to the films in a direction perpendicular to the easy axis of the Co—Fe keeper layer 222 and a magnetic field to the films in a direction parallel or antiparallel to the easy axis, in order to determine $H_{CE}$, $H_{UA}$ and $T_S$.

Figure 8:
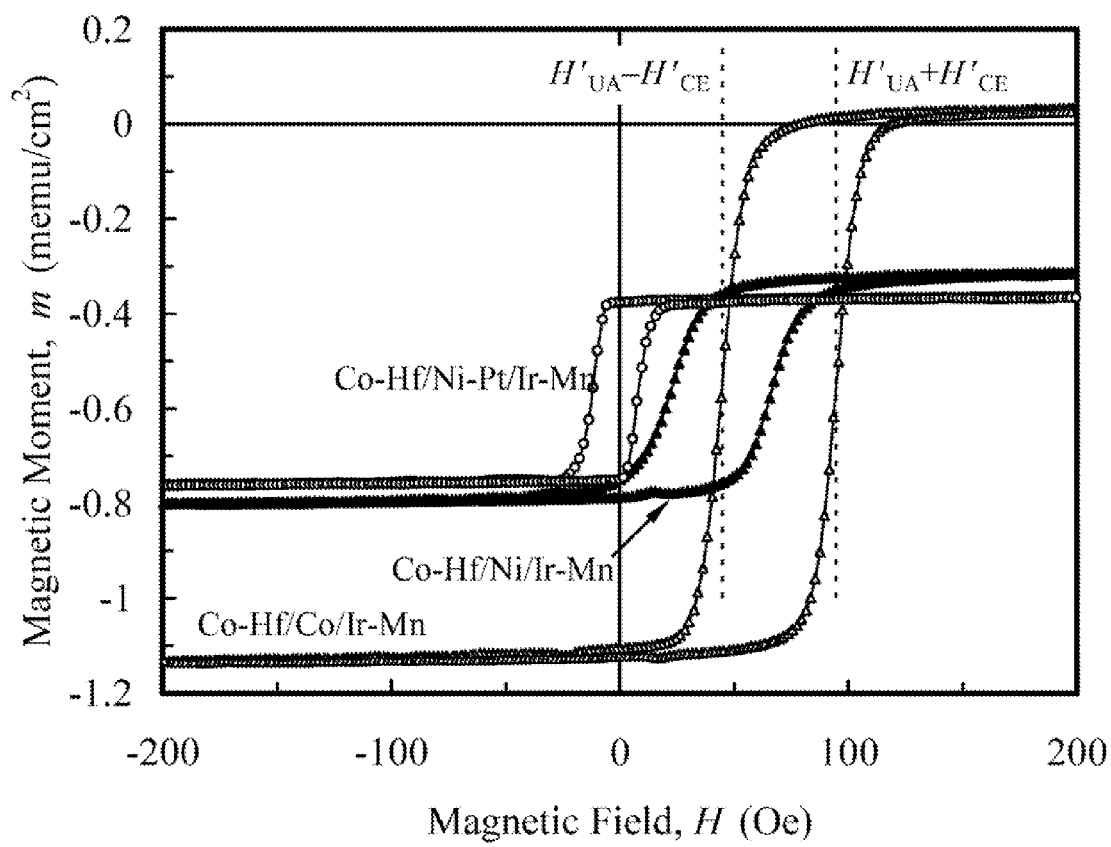
FIG. 8 is a chart showing easy-axis magnetic responses of various ferromagnetic buffer and seed layers beneath antiferromagnetic Ir—Mn pining layers after annealing for 5 hours at 280° C.

FIG. 8 shows easy-axis magnetic responses of various ferromagnetic buffer and seed layers beneath the antiferromagnetic Ir—Mn pining layers 220 after annealing for 5 hours at 280° C. in accordance with the preferred embodiment of the invention. While the ferromagnetic Co, Co—Fe, Ni and Ni—Fe seed layers exchange-couple with the antiferromagnetic Ir—Mn pinning layer 220, inducing unwanted $H'_{UA}$ values of 69.8, 94.4, 44.9 and 64.6 Oe, respectively, the ferromagnetic Ni—Pt seed layer 718 does not exchange-couple with the antiferromagnetic Ir—Mn pinning layer 220 at all. The ferromagnetic Ni—Pt seed layer 718 can thus replace the nonmagnetic Ru seed layer 218 and cause the reduction of the read gap by 2 nm, without inducing undesired exchange-coupling.

Figure 9:
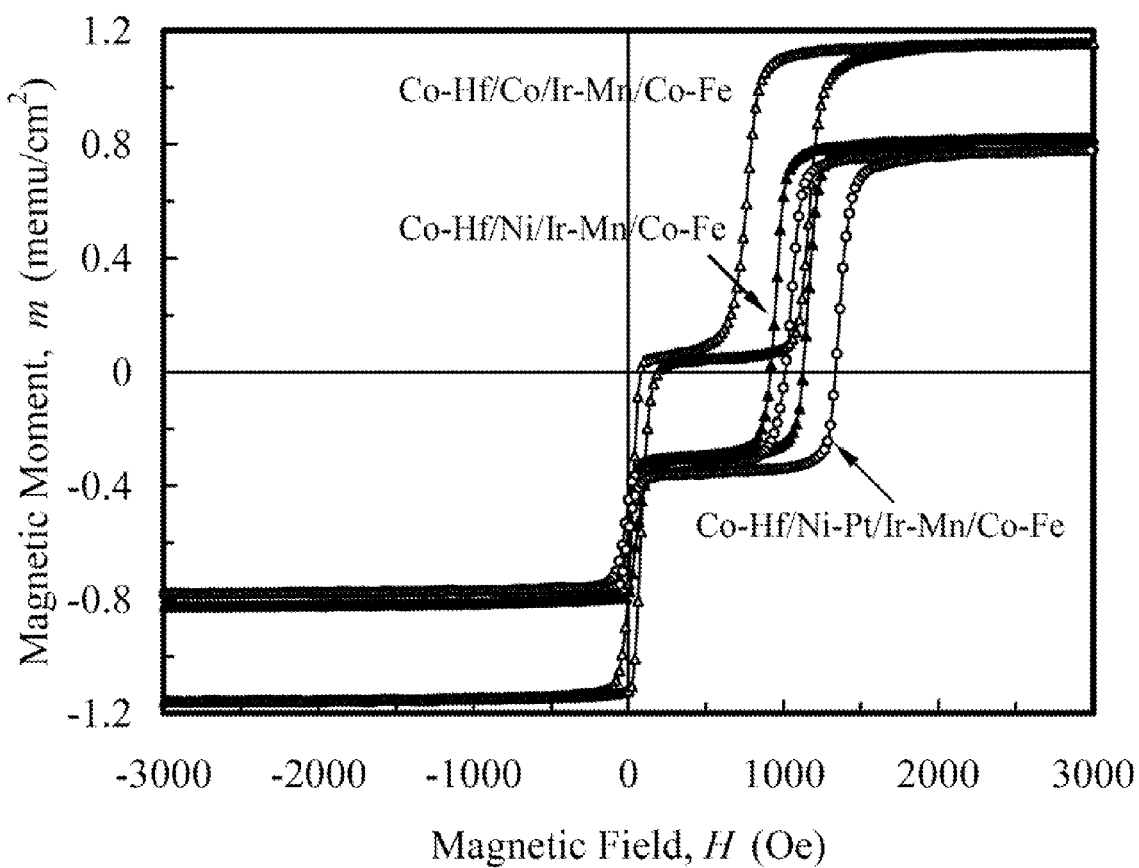
FIG. 9 is a chart showing easy-axis magnetic responses of Ir—Mn/Co—Fe films with various ferromagnetic buffer and seed layers after annealing for 5 hours at 280° C.

FIG. 9 shows easy-axis magnetic responses of the Ir—Mn/Co—Fe films with various ferromagnetic buffer and seed layers after annealing for 5 hours at 280° C. in accordance with the preferred embodiment of the invention. $H_{CE}$ values of the Ir—Mn/Co—Fe films with the Co, Co—Fe, Ni, Ni—Fe and Ni—Pt seed layers are determined to be 191, 140, 98, 119 and 151 Oe, respectively, and $H_{UA}$ values 970, 434, 1,056, 1,052 and 1,209 Oe, respectively (corresponding to $J_K$ values of 0.543, 0.243, 0.595, 0.601 and 0.694 erg/cm², respectively). The ferromagnetic Ni—Pt seed layer 718 can thus ensure the microstructural effects needed for the Co—Fe keeper layer 222 to exhibit good magnetic properties.

Figure 10:
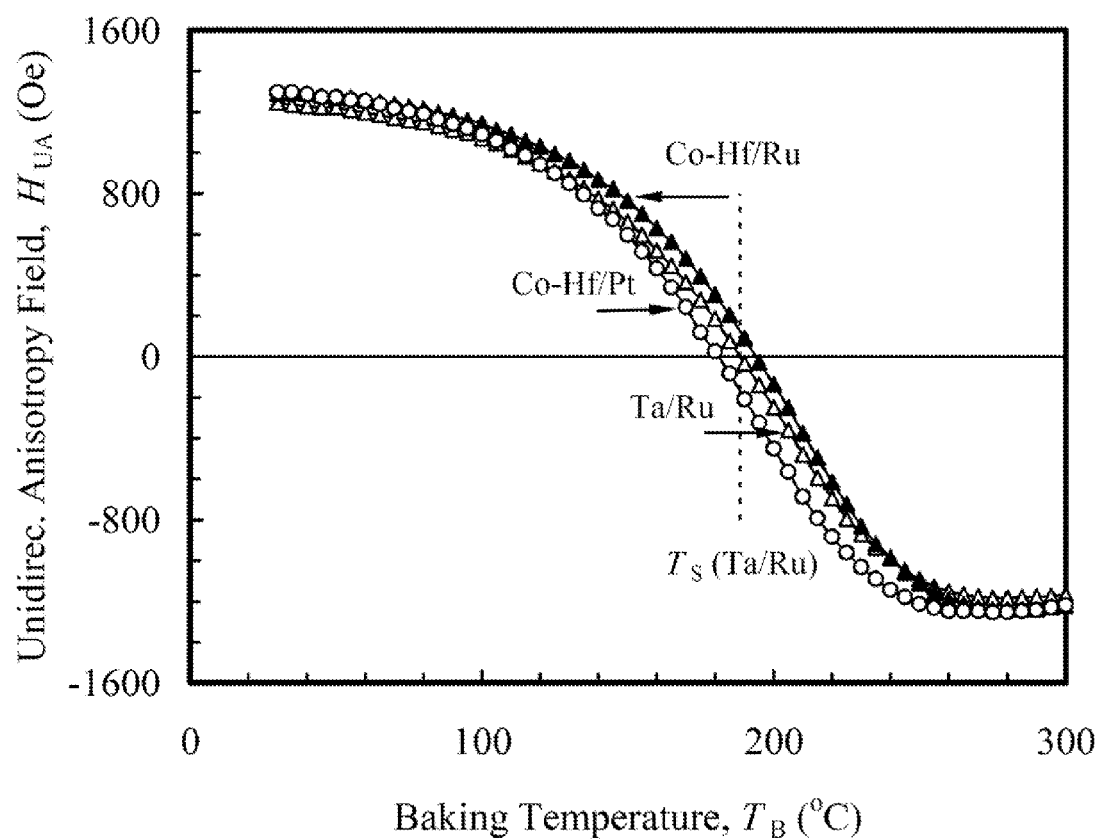
FIG. 10 is a chart showing $H_{UA}$ determined from easy-axis resistance responses versus $T_B$ for Co—Hf(2)/75.2Ni-24.8Pt(4)/Ir—Mn($\delta_{NM}$)/Co—Fe(3.6)/Ru(2)/Ta(2)/Ru(4) films before and after baking at $T_B$ in accordance with a preferred embodiment of the invention.

FIG. 10 shows $H_{UA}$ determined from the easy-axis resistance responses versus $T_B$ for the Co—Hf(2)/75.2Ni-24.8Pt (4)/Ir—Mn($\delta_{NM}$)/Co—Fe(3.6)/Ru(2)/Ta(2)/Ru(4) films before and after baking at $T_B$ accordance with the preferred embodiment of the invention. $H_{UA}$ decreases to zero at $T_S$ values of 187.3, 195.8, 203.9 and 211.1° C. for $\delta_{NM}$ of 6.0, 6.4, 6.8 and 7.2 nm, respectively. Therefore, the replacements of the nonmagnetic Ta buffer layer 216 with the ferromagnetic Co—Hf buffer layer 316, and the nonmagnetic Ru seed layer 218 with the ferromagnetic Ni—Pt seed layer 718 lead to a negligible decrease in $T_S$ from 189.6 to 187.3° C. In addition, a slight increase in the thickness of the antiferromagnetic Ir—Mn pinning layer 220 causes a substantial increase in $T_S$, but also slightly discounts the full advantage on the read gap reduction by 4 nm.

Table 2 summarizes $H'_{CE}$, $H_{CE}$, $H_{UA}$, $J_K$ and $T_S$ determined from the easy-axis magnetic and resistance responses of the Ir—Mn/Co—Fe films with various buffer and seed layers before and after baking at $T_B$ in accordance with the preferred embodiment of the invention. The ferromagnetic Co, Co—Fe, Ni or Ni—Fe film is apparently not suitable for the use as the desired ferromagnetic seed layer since it exchange-couples with the antiferromagnetic Ir—Mn pinning layer 220, inducing an unwanted $J'_K$. By doping sufficient nonmagnetic Hf atoms into a Co film, or sufficient nonmagnetic Ir and Mn atoms into a Ni film, $J'_K$ becomes zero and $J_K$ becomes very low, indicating that the nonmagnetic atoms might diffuse into the antiferromagnetic Ir—Mn pinning layer 220 and deteriorate the desired ferromagnetic/antiferromagnetic coupling. On the other hand, by doping sufficient nonmagnetic Pt atoms into the Ni film, $J'_K$ also becomes zero while $J_K$ and $T_S$ still remain high, indicating that the Pt atoms remain intact after directly contacting the antiferromagnetic Ir—Mn pinning layer 220. Therefore, it is feasible to replace the nonmagnetic Ta buffer layer 216 with the ferromagnetic Co—Hf buffer layer 316 and replace the nonmagnetic Ru seed layer 218 with the ferromagnetic Ni—Pt seed layer 718 for reducing the read gap by 4 nm.

| Ferromagnetic Buffer Layer | Ferromagnetic Seed Layer | H'$_{CE}$ (Oe) | H'$_{UA}$ (Oe) | J'$_K$ (erg/cm$^2$) | H$_{CE}$ (Oe) | H$_{UA}$ (Oe) | J$_K$ (erg/cm$^2$) | T$_S$ (° C.) |
|---|---|---|---|---|---|---|---|---|
| Co—Hf(2) | None | 6.2 | 0 | 0 | 164 | 242 | 0.135 | 202.3 |
| Co—Hf(2) | Co(4) | 24.9 | 69.8 | 0.041 | 191 | 970 | 0.543 | 184.0 |
| Co—Hf(2) | Co—Fe(4) | 42.2 | 94.4 | 0.063 | 140 | 434 | 0.243 | NA |
| Co—Hf(2) | Ni(4) | 21.9 | 44.9 | 0.011 | 98 | 1,056 | 0.595 | 172.0 |
| Co—Hf(2) | Ni—Fe(4) | 26.6 | 64.6 | 0.019 | 119 | 1,052 | 0.601 | 173.7 |
| Co—Hf(2) | Ni—Pt(4) | 10.0 | 0 | 0 | 151 | 1,209 | 0.694 | 187.3 |
| Co—Hf(2) | Ni—Ir—Mn(4) | 18.4 | 0 | 0 | 511 | 658 | 0.368 | NA |

Figure 11:
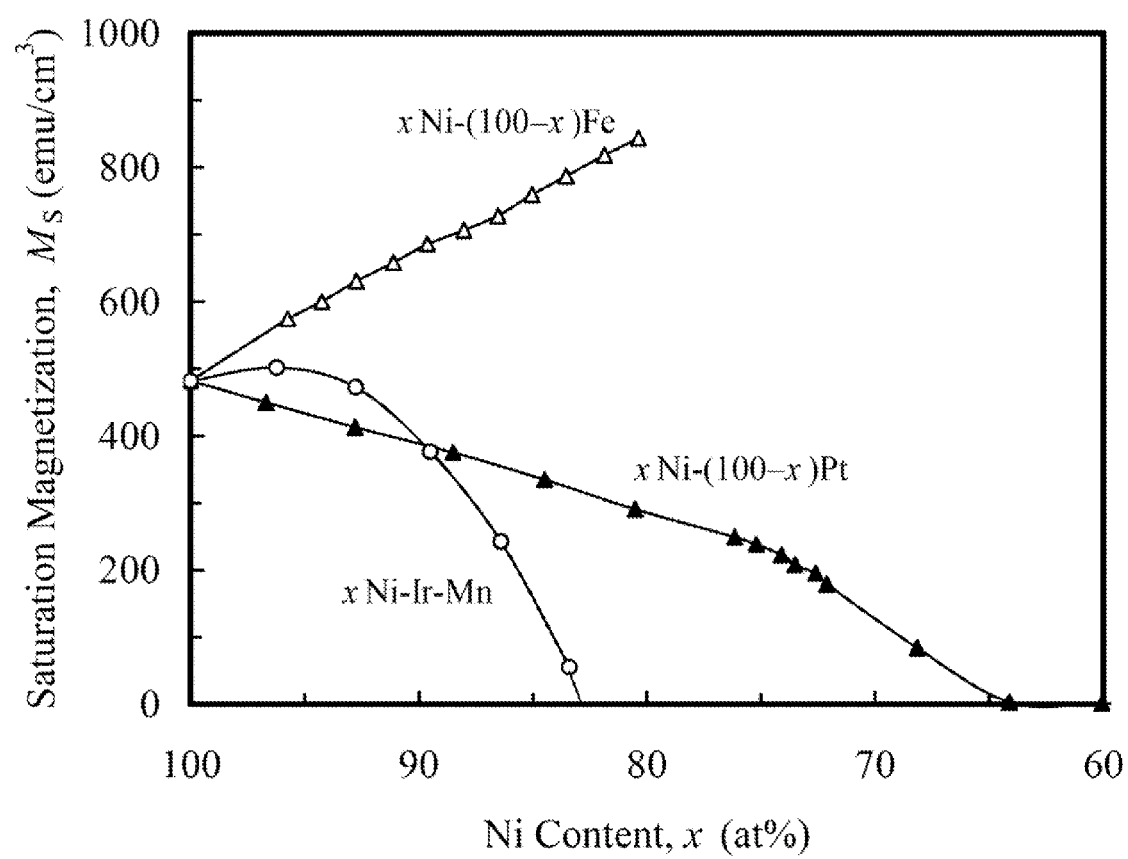
FIG. 11 is a chart showing the saturation magnetization ($M_S$) versus the Ni content for Ni—Fe, Ni—Pt and Ni—Ir—Mn films.

The composition and thickness of the ferromagnetic Ni—Pt seed layer 718 requires optimization in order to maximize advantages as described in the preferred embodiment of the invention. FIG. 11 shows the saturation magnetization (M$_S$) versus the Ni content of a seed layer formed of a Ni—Fe, Ni—Pt or Ni—Ir—Mn film. M$_S$ increases from 481.7 to 843.6 emu/cm$^3$ as the Ni content of the Ni—Fe film decreases from 100 to 80.4 at %, or gradually decreases to nearly zero as the Ni content of the Ni—Pt film decreases to 64.1 at %, or slightly increases and then sharply decreases to nearly zero as the Ni content of the Ni—Ir—Mn decreases to 83.4 at %. The Ni content exceeding which M$_S$ becomes zero defines an upper bound of the desired ferromagnetic seed layer.

Figure 12:
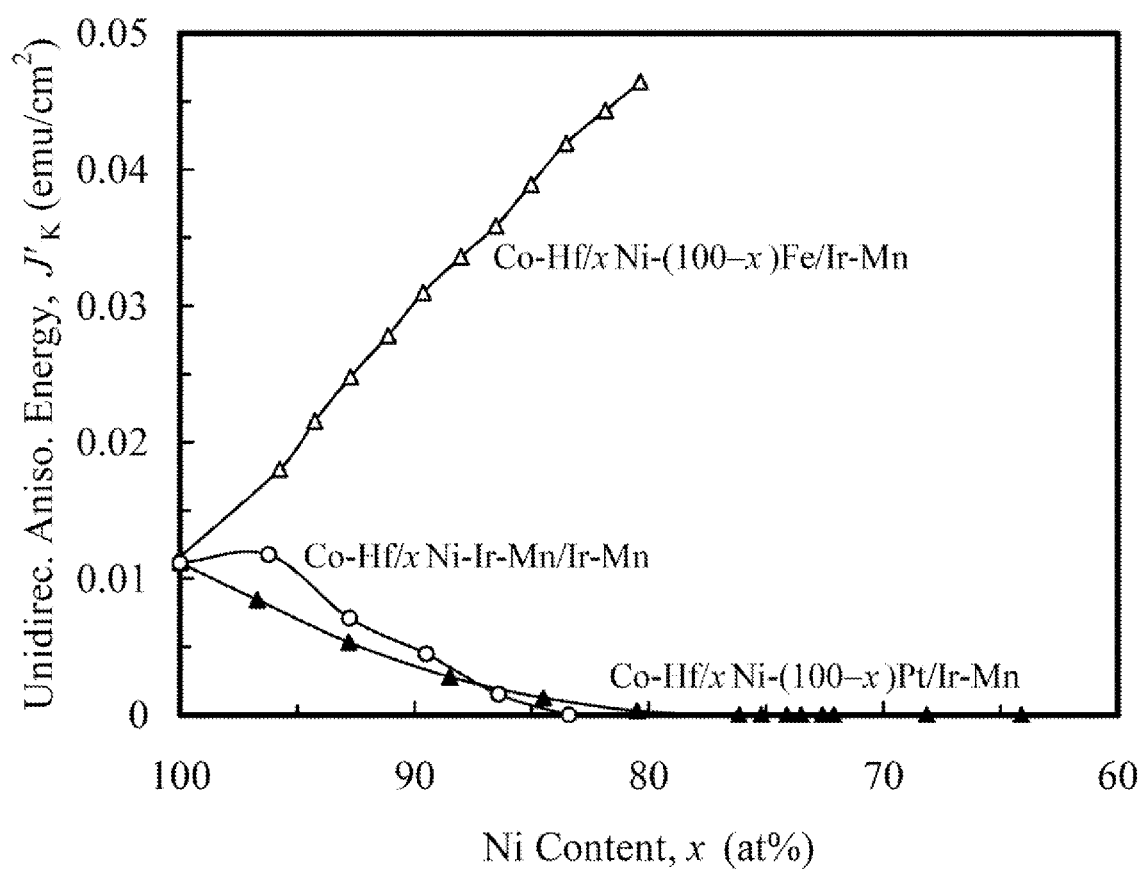
FIG. 12 is a chart showing $J'_K$ of Ni—X seed/Ir—Mn pinning layers (where X is Fe, Pt or Ir—Mn) versus the Ni content of the seed layer after annealing for 5 hours at 280° C.

FIG. 12 shows J'$_K$ of Ni—X seed/Ir—Mn pinning layers (where X is Fe, Pt or Ir—Mn) versus the Ni content of the seed layer after annealing for 5 hours at 280° C. J'$_K$ increases from 0.011 to 0.046 erg/cm$^2$ as the Ni content of the Ni—Fe film decreases from 100 to 80.4 at %, or decrease to nearly zero as the Ni content of the Ni—Pt film decreases from 100 to 80.5 at %, or also decreases to nearly zero as the Ni content of the Ni—Ir—Mn decreases from 100 to 83.4 at %. The Ni content exceeding which J'$_K$ becomes zero defines a lower bound of the desired ferromagnetic seed layer.

FIGS. 11 and 12 reveal that in order to be ferromagnetic but not to exchange-couple with the antiferromagnetic Ir—Mn pinning layer 220, the Ni—Pt film must have a Ni content ranging from 64.1 to 80.5 at %, while the Ni—Ir—Mn film at around 83.4 at % only. In addition to these strict requirements, the uses of the Ni—Pt and Ni—Ir—Mn films with these specified narrow Ni contents must lead to high J$_K$ and T$_S$, as described below.

Figure 13:
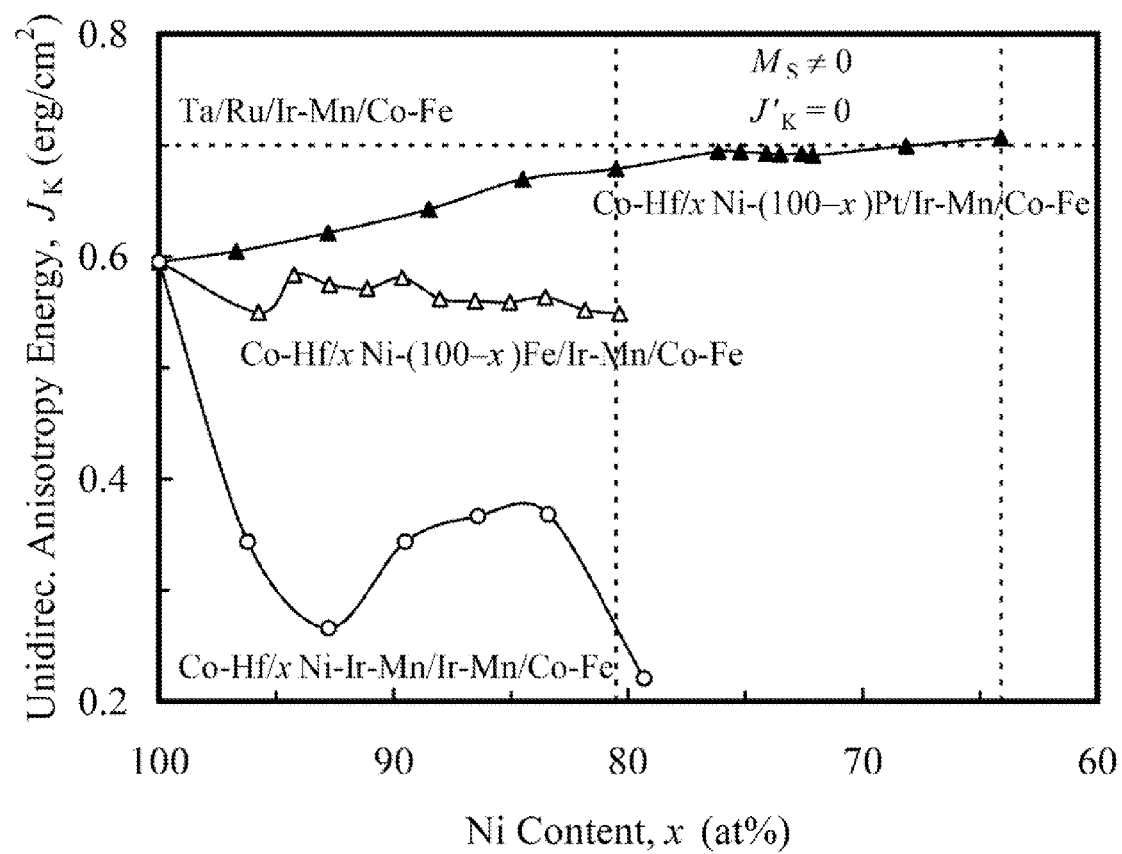
FIG. 13 is a chart showing $J_K$ versus the Ni content of the seed layer for Co—Hf(2)/Ni—X(4)/Ir—Mn(6)/Co—Fe(3.6)/Ru(2)/Ta(2)/Ru(4) films (where X is Fe, Pt or Ir—Mn) after annealing for 5 hours at 280° C.

FIG. 13 shows versus the Ni content (x) for the Co—Hf(2)/xNi—X(4)/Ir—Mn(6)/Co—Fe(3.6)/Ru(2)/Ta(2)/Ru(4) films (where X is Fe, Pt or Ir—Mn) after annealing for 5 hours at 280° C. decreases from 0.595 to 0.549 erg/cm$^2$ as the Ni content of the Ni—Fe film decreases from 100 to 80.4 at %. On the other hand, J$_K$ increases from 0.595 to 0.707 erg/cm$^2$ as the Ni content of the Ni—Pt film decreases from 100 to 64.1 at %. However, the use of the Ni—Ir—Mn film leads to a very low J$_K$.

Figure 14:
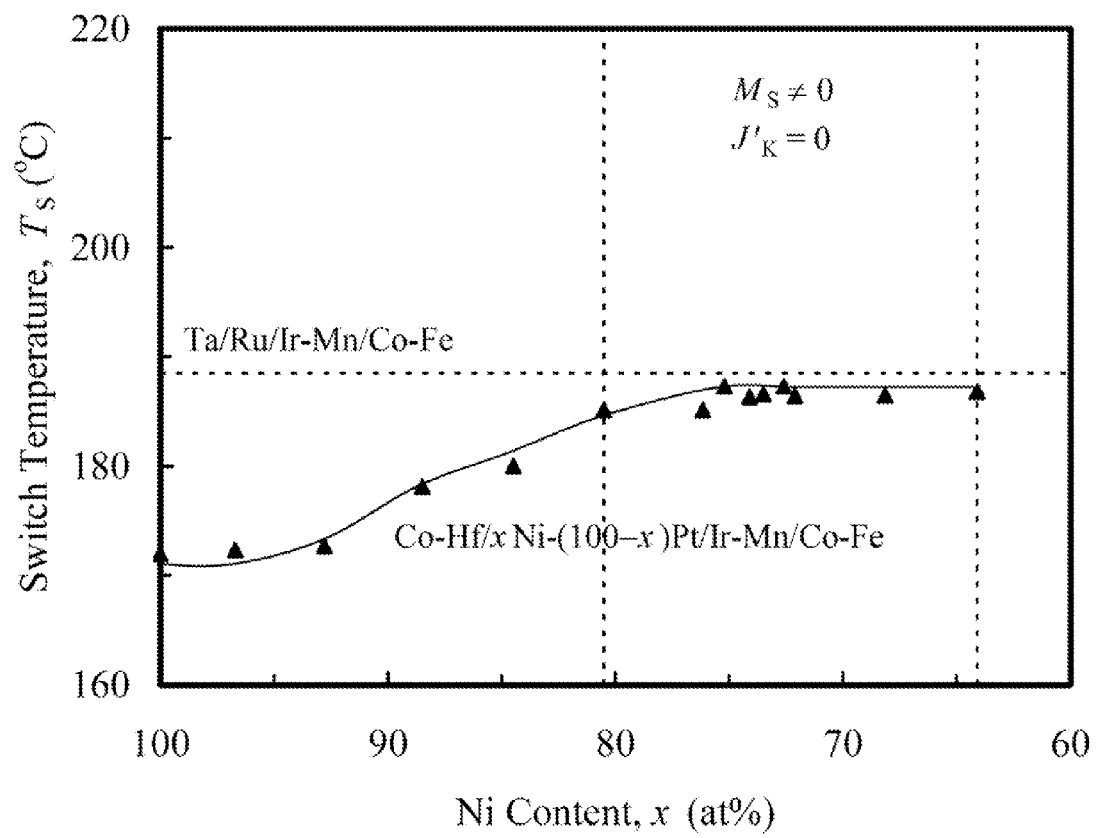
FIG. 14 is a chart showing $T_S$ versus the Ni content of the seed layer for Co—Hf(2)/Ni—Pt(4)/Ir—Mn(6)/Co—Fe(3.6)/Ru(2)/Ta(2)/Ru(4) films after annealing for 5 hours at 280° C.

FIG. 14 shows T$_S$ versus the Ni content (x) for the Co—Hf(2)/xNi-(100−x)Pt(4)/Ir—Mn(6)/Co—Fe(3.6)/Ru(2)/Ta(2)/Ru(4) films after annealing for 5 hours at 280° C. T$_S$ increases from 172.0 to 187.3° C. as the Ni content decreases from 100 to 75.2 at %, and remains nearly unchanged as the Ni content continues to decrease to 64.1 at %. Experimental findings as shown in FIGS. 13 and 14 can be explained below. As Ni atoms of as small as 0.324 nm in diameter are progressively replaced by Pt atoms of as larger as 0.366 nm in diameter, the lattice constant of an fcc unit cell formed by the Ni and Pt atoms increases from that of an fcc unit cell formed by the Ni atoms only (0.3527 nm) to that of an fcc unit cell formed by the Pt atoms only (0.3947 nm). In order for an fcc unit cell formed by the Ir and Mn atoms with a lattice constant of 0.3778 nm to grow coherently, the Ni content of the fcc unit cell formed by the Ni and Pt atoms preferably ranges from 75.2 to 64.1 at % so that its lattice constant may range from of 0.3656 to 0.3710 nm, while ensuring that M$_S$ still remains and J'$_K$ becomes zero. This nearly coherent growth associated with some strains may cause increases in both J$_K$ of T$_S$.

Figure 15:
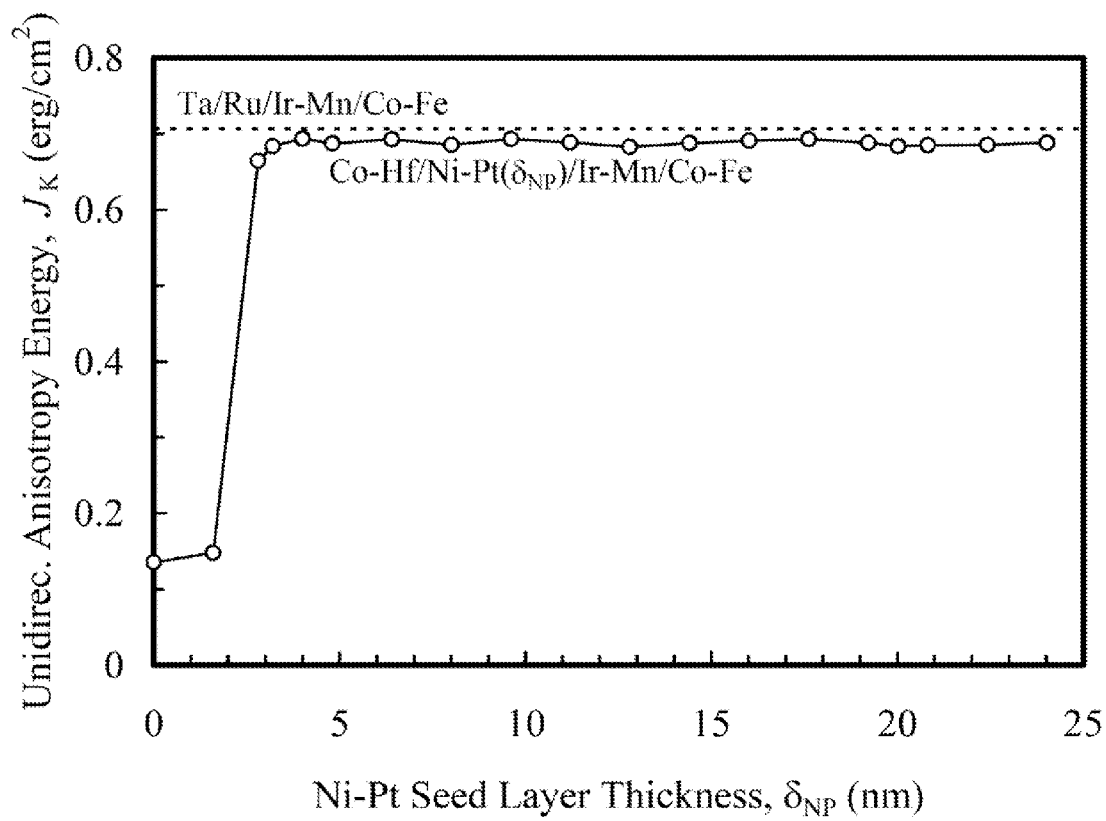
FIG. 15 is a chart showing $J_K$ versus the Ni—Pt seed layer thickness for Co—Hf(2)/75.2Ni-24.8Pt/Ir—Mn(6)/Co—Fe(3.6)/Ru(2)/Ta(2)/Ru(4) films after annealing for 5 hours at 280° C.

FIG. 15 shows J$_K$ versus the Ni—Pt seed layer thickness ($\delta_{NP}$) for the Co—Hf(2)/75.2Ni-24.8Pt($\delta_{NP}$)/Ir—Mn(6)/Co—Fe(3.6)/Ru(2)/Ta(2)/Ru(4) films after annealing for 5 hours at 280° C. J$_K$ increases from 0.135 to 0.684 crg/cm$^2$ as $\delta_{NP}$ increases from 0 to 3.2 nm, and remains nearly unchanged as $\delta_{NP}$ continues to increase beyond 20 nm. $\delta_{NP}$ thus preferably ranges from 3.2 to beyond 20 nm. Although the ferromagnetic Ni—Pt seed layer 718 acts as a portion of the ferromagnetic Ni—Fe lower shield 206 and can thus be as thick as desired, it is still preferably thin enough to minimize waviness on its topography, which is more severe as the Ni—Pt seed layer is thicker. Therefore, a 4 nm thick Ni—Pt seed layer is recommended in the preferred embodiment of the invention.

Figure 16:
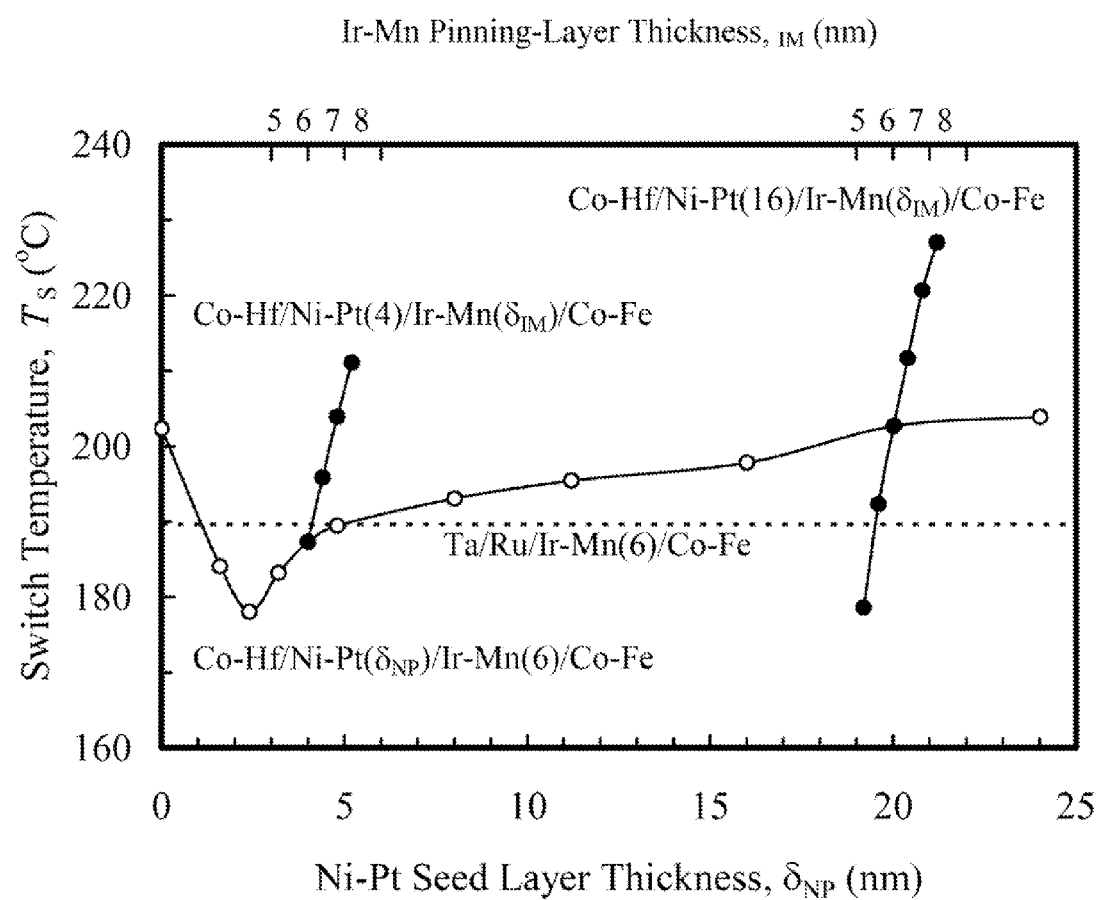
FIG. 16 is a chart showing $T_S$ versus the Ni—Pt seed layer thickness for Co—Hf(2)/75.2Ni-24.8Pt/Ir—Mn(6)/Co—Fe(3.6)/Ru(2)/Ta(2)/Ru(4) films after annealing for 5 hours at 280° C.

FIG. 16 shows T$_S$ versus the Ni—Pt seed layer thickness ($\delta_{NP}$) for the Co—Hf(2)/75.2Ni-24.8Pt($\delta_{NP}$)/Ir—Mn($\delta_{IM}$)/Co—Fe(3.6)/Ru(2)/Ta(2)/Ru(4) films after annealing for 5 hours at 280° C. Without the Ni—Pt seed layer 718 but with $\delta_{IM}$ at 6 nm, T$_S$ is unexpectedly as high as 202.3° C. This high T$_S$ is not attractive though since J$_K$ is as low as 0.135 erg/cm$^2$. While maintaining $\delta_{IM}$ at 6 nm, T$_S$ decreases from 202.3 to 178.0° C. as $\delta_{NP}$ increases from 0 to 2.4 nm, and then increases from 178.0 to 203.9° C. as $\delta_{NP}$ increases from 2.4 to 24.0 nm. $\delta_{NP}$ is thus preferably thick enough to ensure a high T$_S$. On the other hand, while maintaining $\delta_{NP}$ at 4 nm, T$_S$ increases from 187.3 to 211.1° C. as $\delta_{IM}$ increases from 6 to 7.2 nm. Therefore, a slight increase in $\delta_{IM}$ can facilitate the 4 nm thick Ni—Pt seed layer 718 to exhibit substantially higher T$_S$. This approach is acceptable as long as the advantage on the read gap reduction in accordance with the preferred embodiment of the invention is still partially attained. In addition, while maintaining $\delta_{NP}$ at 20 nm, T$_S$ increases from 178.6 to 226.7° C. as $\delta_{IM}$ increases from 5.2 to 7.2 nm. Therefore, if a thicker ferromagnetic Ni—Pt seed layer 718 can be smoothened with a plasma treatment, it can act as a portion of the ferromagnetic Ni—Fe lower shield 206 and facilitate the CPP TMR read sensor 701 to exhibit a higher T$_S$. In addition, the Ir—Mn pinning layer 220 can be thinner to further decrease the read gap 740 while maintaining a high T$_S$, or thicker to further increase T$_S$ substantially while slightly increasing the read gap 740.

In order to ensure that the uses of the ferromagnetic Co—Fe buffer layer 316 and the ferromagnetic Ni—Pt seed layer 718 in accordance with the preferred embodiment of the invention will not lead to deterioration of magnetic and TMR properties, the CPP TMR read sensors 201, 301, 701 in accordance with the prior arts and the preferred embodiment of the invention are fabricated and evaluated as described below.

In the read head fabrication process, Ta(2)/Ru(2)/23.2Ir-76.8Mn(6), 75.5Co-24.5Hf(2)/Ru(2)/23.2Ir-76.8Mn(6) or 75.5Co-24.5Hf(2)/75.2Ni-24.8Pt(4)/23.2Ir-76.8Mn(6) films are deposited on a bare glass substrate and on a wafer with a 1,000 nm thick ferromagnetic Ni—Fe lower shield 206 in a first module of a sputtering system, and 72.5Co-27.5Fe(1.6) 164.1Co-35.9Fe(0.6)/Ru(0.8)/64.1Co-35.9Fe(0.6)/75.5Co-24.5Hf(0.6)/65.5Co-19.9Fe-14.6B(1.3) films are then sequentially deposited in a second module of the sputtering system. After applying a plasma treatment for 72 seconds at a substrate power of 20 W to partially remove the Co—Fe—B film by about 0.1 nm and to smoothen the surface of the lower sensor stack 212, a 0.3 nm thick 46.8Co-53.2Fe film is deposited and the $MgO_X$ barrier layer is then formed in a third module of the sputtering system, as described below.

After slightly cleaning a Mg target, a 0.2 nm thick Mg film is DC-deposited from the Mg target, and a light oxygen treatment is then applied for oxygen doping into the Mg film. After heavily cleaning the third module with Ti gettering and slightly cleaning a MgO target, a 0.4 nm thick MgO film is RF-deposited from the MgO target, another 0.2 nm thick Mg film is DC-deposited from the Mg target, and then a heavy oxygen treatment is applied for oxygen doping into the entire $MgO_X$ barrier layer 210.

After the formation of the $MgO_X$ barrier layer 210, 87.5Co-12.5Fe(0.4)/79.3Co-4.0Fe-16.7B(1.6)/87.1Co-12.9Hf(2.8)/Ru(2)/Ta(2)/Ru(4) films are deposited in a fourth module of the sputtering system. After annealing in a magnetic field of 50,000 Oe for 5 hours at 280° C. in a high-vacuum oven, the CPP TMR read sensor deposited on the bare glass substrate is measured with the VSM to characterize magnetic properties. On the other hand, the CPP TMR read sensor deposited on the wafer with the ferromagnetic Ni—Fe lower shield 206 is coated with top conducting leads formed of Cu(75)/Ru(12) films, and is probed with a 12-point microprobe in a magnetic field of about 160 Oe. Measured data from any four of the microprobe are analyzed with a current-in-plane tunneling model to characterize TMR properties.

Figure 17:
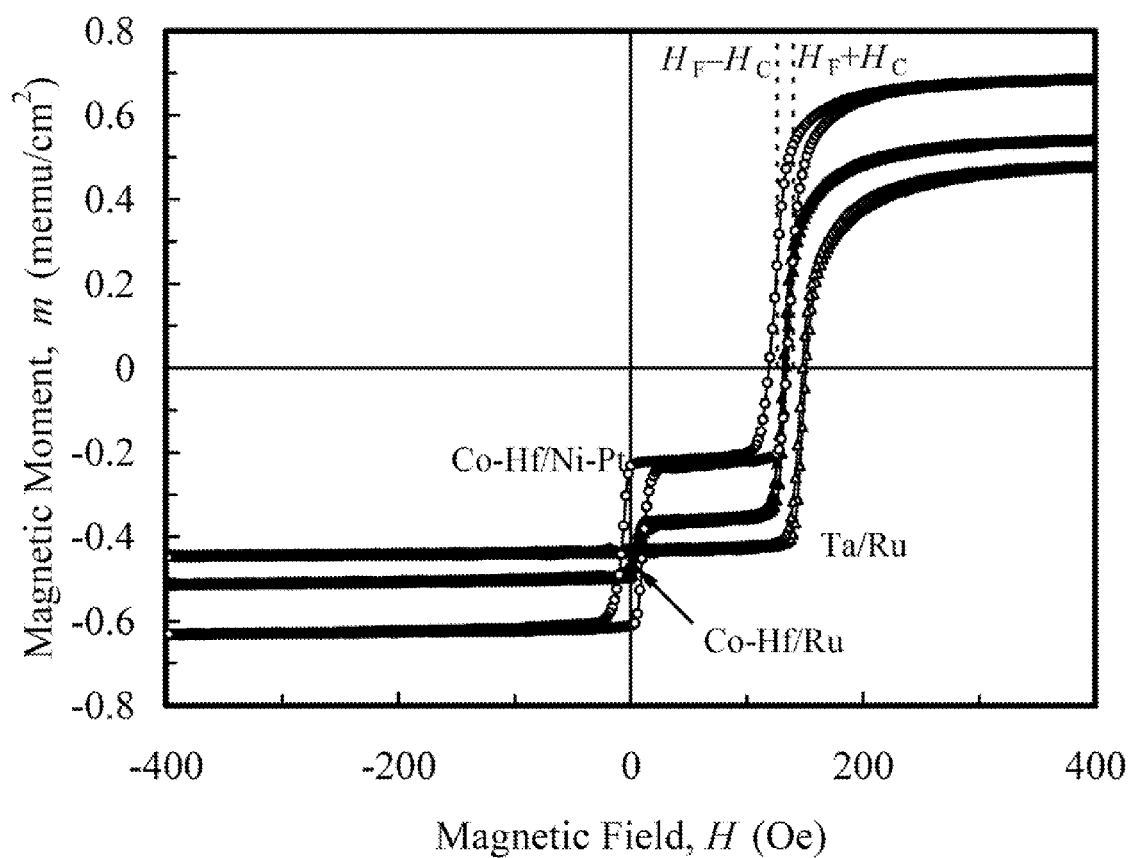
FIG. 17 is a chart showing low-field easy-axis magnetic responses of CPP TMR read sensors with various buffer and seed layers after annealing for 5 hours at 280° C.

FIG. 17 shows low-field easy-axis magnetic responses of the CPP TMR read sensors with various buffer and seed layers after annealing for 5 hours at 280° C. Two types of hysteresis loops can be identified, one centered and the other shifted. The small centered hysteresis loop originates from the easy-axis magnetic responses of the ferromagnetic Co—Hf buffer layer 316 that is exchange-decoupled by the nonmagnetic Ru seed layer 218 from the antiferromagnetic Ir—Mn pinning layer 220. The large centered hysteresis loop originates from the easy-axis magnetic responses of the ferromagnetic Co—Hf buffer layer 316 and the ferromagnetic Ni—Pt seed layer 718 that indeed does not exchange-couple with the antiferromagnetic Ir—Mn pinning layer 220 at all. On the other hand, the shifted hysteresis loop originates from the easy-axis magnetic responses of the sense layer structure 228. With the Ta buffer/Ru seed, Co—Hf buffer/Ru seed and Co—Hf buffer/Ni—Pt seed layers, the sense layer structures 228 exhibit $H_C$ values of 1.4, 1.2 and 6.9 Oe, respectively, and $H_F$ values of 149.9, 132.8 and 127.6 Oe, respectively. The uses of the ferromagnetic Co—Hf buffer layer 316 and the ferromagnetic Ni—Pt seed layer 718 lead to higher $H_C$ probably due to a larger grain morphology induced by lattice matching, and lower $H_C$ probably due to a smoother topography induced by doping with the Pt atoms.

Figure 18:
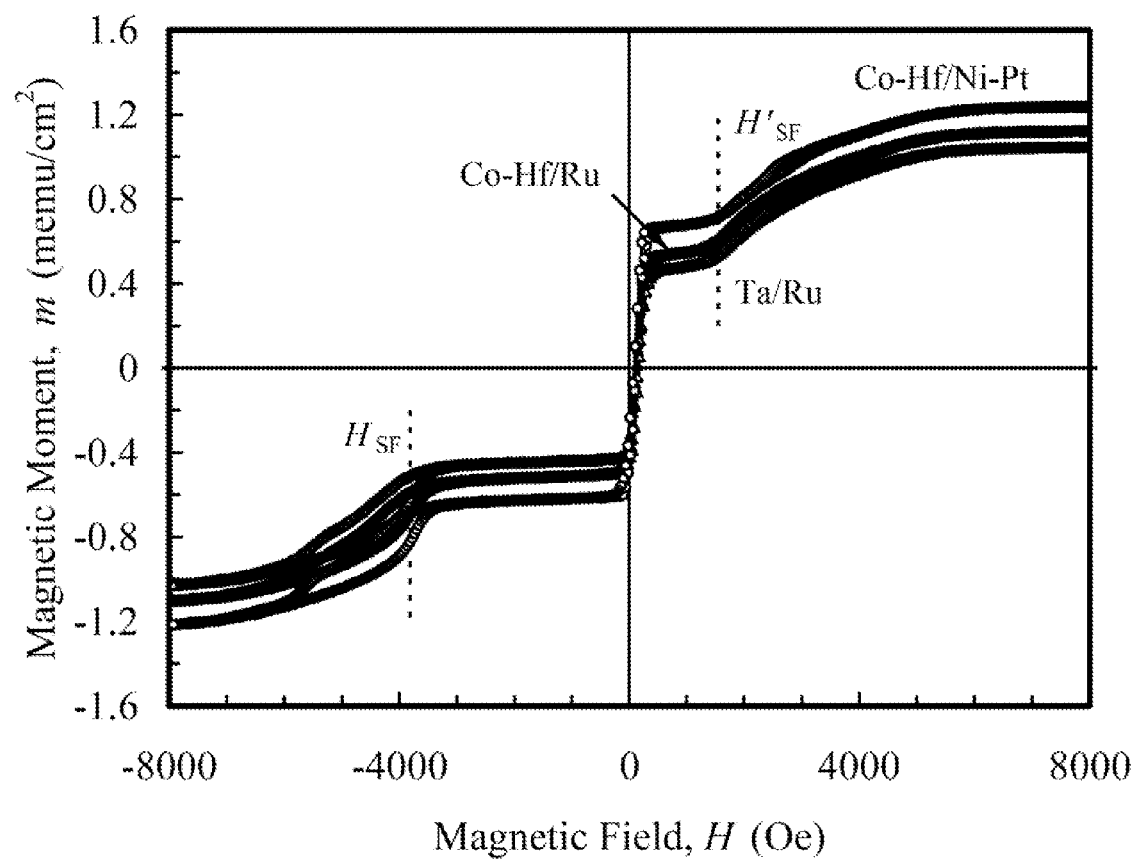
FIG. 18 is a chart showing high-field easy-axis magnetic responses of CPP TMR read sensors with various buffer and seed layers after annealing for 5 hours at 280° C.

FIG. 18 shows high-field easy-axis magnetic responses of the CPP TMR read sensors with various buffer and seed layers after annealing for 5 hours at 280° C. In addition to indistinguishable centered and shifted hysteresis loops as described in FIG. 17, two hard-axis-like tilted hysteresis loops can be identified. The left tilted hysteresis loop originates from the easy-axis magnetic responses of the keeper layer structure 222. As the magnetic field exceeds a spin-flop field ($H_{SF}$), the magnetization of the keeper layer structure 222 spin-flops immediately and starts its hard-axis-like behavior. The $H_{SF}$ strength reveals an additive effect of $H_{BA}$ and $H_{UA}$. The right tilted hysteresis loop originates from the easy-axis magnetic responses of the reference layer structure 224. As the magnetic field exceeds another spin-flop field ($H'_{SF}$), the magnetization of the reference layer structure 224 spin-flops immediately and starts its hard-axis-like behavior. The $H'_{SF}$ strength reveals a subtractive effect of $H_{BA}$ and $H_{UA}$. With the Ta buffer/Ru seed, Co—Hf buffer/Ru seed and Co—Hf buffer/Ni—Pt seed layers, the keeper layer structures 222 exhibit $H_{SF}$ of 3,773, 3,693 and 3,812 Oe, respectively, while the reference layer structures 224 exhibit $H'_{SF}$ of 1,543, 1,503 and 1,583 Oe, respectively. Therefore, the CPP TMR read sensors with various buffer and seed layers basically exhibit comparable magnetic properties.

Table 3 summarizes $H_C$, $H_F$, $H_{SF}$, $H'_{SF}$, $R_JA_J$ and $\Delta R_T/R_J$ determined from the easy-axis magnetic and resistance responses of the CPP TMR read sensors with various buffer and seed layers after annealing for 5 hours at 280° C. in accordance with the prior arts and the preferred embodiment of the invention. With the Ta buffer/Ru seed, Co—Hf buffer/Ru seed and Co—Hf buffer/Ni—Pt seed layers, the CPP TMR read sensors exhibit $R_JA_J$ of 0.65, 0.63 and 0.63 $\Omega\text{-}\mu m^2$, respectively, and $\Delta R_T/R_J$ of 59.8, 57.1 and 55.8%, respectively. Therefore, the CPP TMR read sensor with various buffer and seed layers basically exhibit comparable TMR properties. It is thus proved that the read gap can be reduced by 4 nm by replacing the nonmagnetic buffer and seed layers with the ferromagnetic buffer and seed layers, without deteriorating the magnetic and TMR properties.

TABLE 3

| Buffer Layer | Seed Layer | $H_C$ (Oe) | $H_F$ (Oe) | $H_{SF}$ (Oe) | $H'_{SF}$ (Oe) | $R_JA_J$ ($\Omega\text{-}\mu m^2$) | $\Delta R_T/R_J$ (%) |
|---|---|---|---|---|---|---|---|
| Ta(2) | Ru(2) | 1.4 | 149.9 | 3,773 | 1,543 | 0.65 | 59.8 |
| Co—Hf(2) | Ru(2) | 1.2 | 132.8 | 3,693 | 1,503 | 0.63 | 57.1 |
| Co—Hf(2) | Ni—Pt(4) | 6.9 | 127.6 | 3,812 | 1,583 | 0.63 | 55.8 |

Alternative Embodiment

Figure 19:
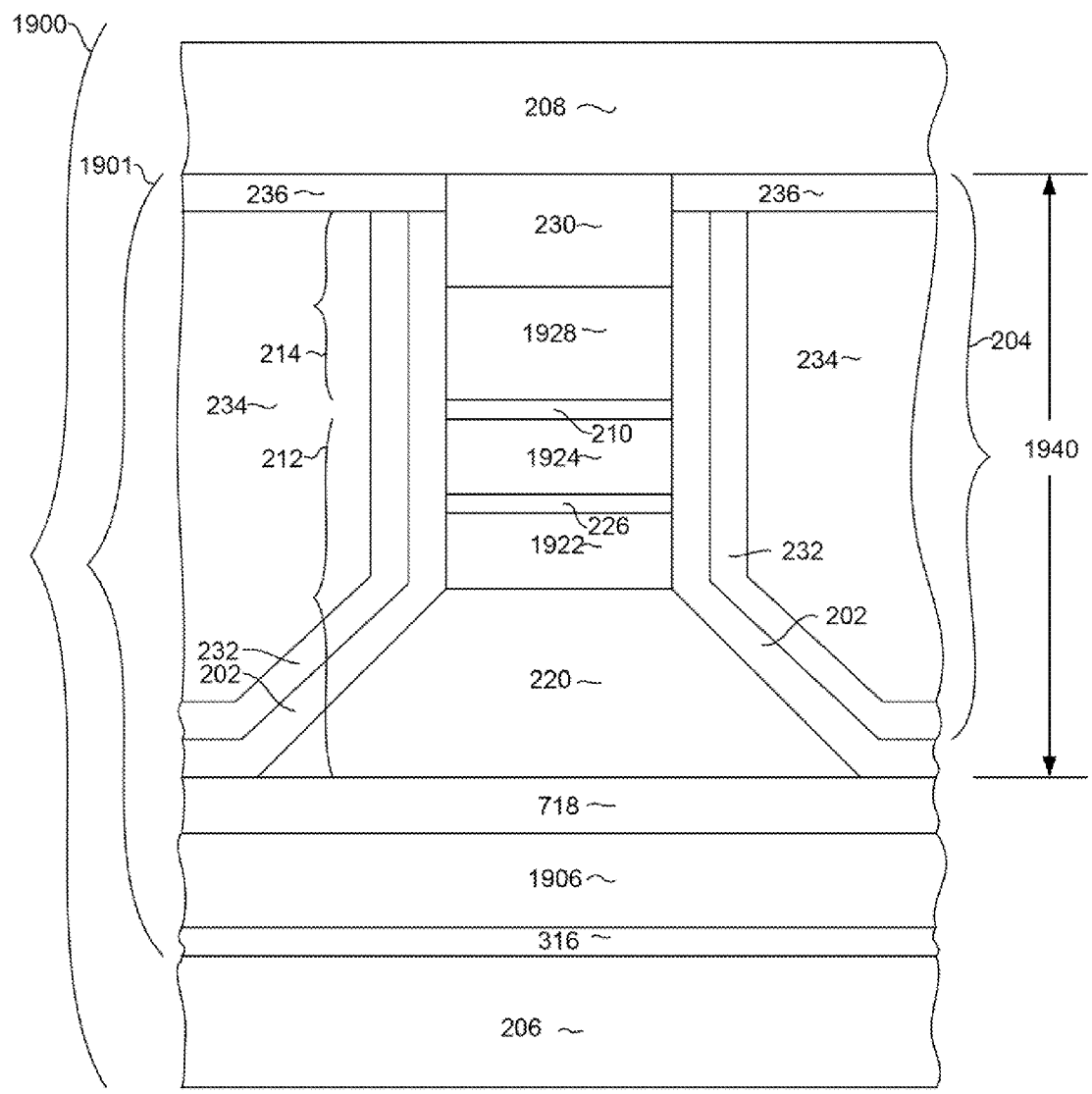
FIG. 19 is an ABS schematic view of a read head in accordance an alternate embodiment of the invention.

FIG. 19 illustrates an ABS view of a read head 1900 in accordance with an alternative embodiment of the invention, which is similar to the read head 700 except that a shielding layer 1906 is sandwiched between the Co—Hf buffer layer 316 and the Ni—Pt seed layer 718, and is also extended from the read region into the two side regions, while a sense layer structure 1928 comprises four sense layer. The shielding layer 1906 is preferably formed of a Ni—Fe film with an Fe content of up to 40 at % and with a thickness of up to 40 nm. Since the Co—Hf buffer layer 316, the Ni—Fe shielding layer 1906 and the Ni—Pt seed layer 718 are all ferromagnetic, they act as portions of the ferromagnetic Ni—Fe lower shield 206, and the upper surface of the Ni—Pt seed layer 718 thus defines the lower bound of the read gap 1940.

The Ni—Fe shielding layer 1906 preferably contains about 20 at % Fe identical to that of the Ni—Fe lower shield 206, thereby exhibiting magnetic properties (such as a saturation magnetostriction, a permeability, easy-axis and hard-axis coercivities, etc.) exactly identical to those of the Ni—Fe lower shield 206 and desirable for shielding magnetic fluxes stemming from the magnetic disk 112.

The Ni—Fe shielding layer 1906 thus acts identically as the Ni—Fe lower shield 206. However, in contrast to the Ni—Fe lower shield 206 exhibiting a non-uniform equal-axial grain morphology formed in a plating deposition process, the Ni—Fe shielding layer 1906 exhibits a uniform columnar grain morphology formed freely on the amorphous foundation provided by the Co—Hf buffer layer 316 in a sputtering deposition process. This uniform columnar grain morphology will facilitate the CPP TMR read sensor 1901 to develop a large grain morphology and to exhibit a low $R_JA_J$.

Figure 20:
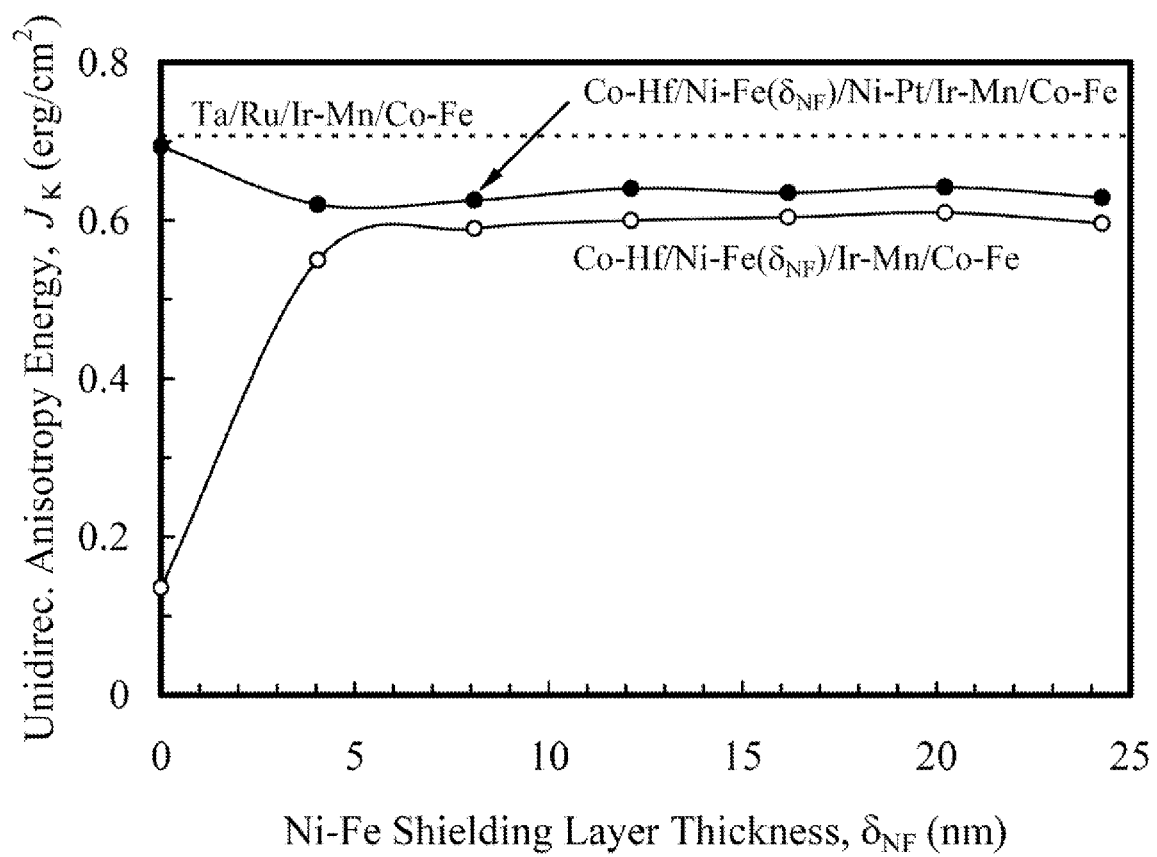
FIG. 20 is a chart showing $J_K$ versus the Ni—Fe shielding layer thickness for Co—Hf(2)/Ni—Fe/Ir—Mn(6)/Co—Fe(3.6)/Ru(2)/Ta(2)/Ru(4) and Co—Hf(2)/Ni—Fe/Ni—Pt(4)/Ir—Mn(6)/Co—Fe(3.6)/Ru(2)/Ta(2)/Ru(4) films after annealing for 5 hours at 280° C.

FIG. 20 shows $J_K$ versus the Ni—Fe shielding layer thickness ($\delta_{NF}$) for Co—Hf(2)/80.4Ni-19.6Fe($\delta_{NF}$)/Ir—Mn(6)/Co—Fe(3.6)/Ru(2)/Ta(2)/Ru(4) and Co—Hf(2)/80.4Ni-19.6Fe($\delta_{NF}$)/75.2Ni-24.8Pt(4)/Ir—Mn(6)/Co—Fe(3.6)/Ru(2)/Ta(2)/Ru(4) films after annealing for 5 hours at 280° C. $J_K$ is as low as 0.135 erg/cm$^2$ when the Co—Hf buffer layer 316 directly contacts the Ir—Mn pinning layer 220, but increases to 0.550 erg/cm$^2$ when a 4 nm thick Ni—Fe shielding layer 1906 is sandwiched between the Co—Hf buffer layer 316 and the Ir—Mn pinning layer 220. $J_K$ is still lower than the desired (0.707 erg/cm$^2$) even when the Ni—Fe shielding layer 1906 is as thick as 24.3 nm. In addition, the Ni—Fe shielding layer 1906 should not directly contact the Ir—Mn pinning layer 220, since unwanted exchange coupling and lattice mismatching between the Ni—Fe shielding layer 1906 and the Ir—Mn pinning layer 220 lead to non-zero $J'_K$ and low $J_K$, respectively. On the other hand, $J_K$ is as high as 0.694 erg/cm$^2$ when the Ni—Pt seed layer 718 is sandwiched between the Co—Hf buffer layer 316 and the Ir—Mn pinning layer 220, but decreases to 0.620 erg/cm$^2$ when a 4 nm thick Ni—Fe shielding layer 1906 is sandwiched between the Co—Hf buffer layer 316 and the Ni—Pt seed layer 718. $J_K$ is still lower than the desired (0.707 erg/cm$^2$) when the Ni—Fe shielding layer 1906 is as thick as 24.3 nm. To attain high spin-flop fields ($H_{SF}$ and $H'_{SF}$) in spite of the low $J_K$, it is recommended to minimize thicknesses of the keeper layer 222 and the reference layer 224, and to use a 0.4 nm thick Ru antiparallel-coupling layer 226 where the antiparallel-coupling strength is maximized.

Figure 21:
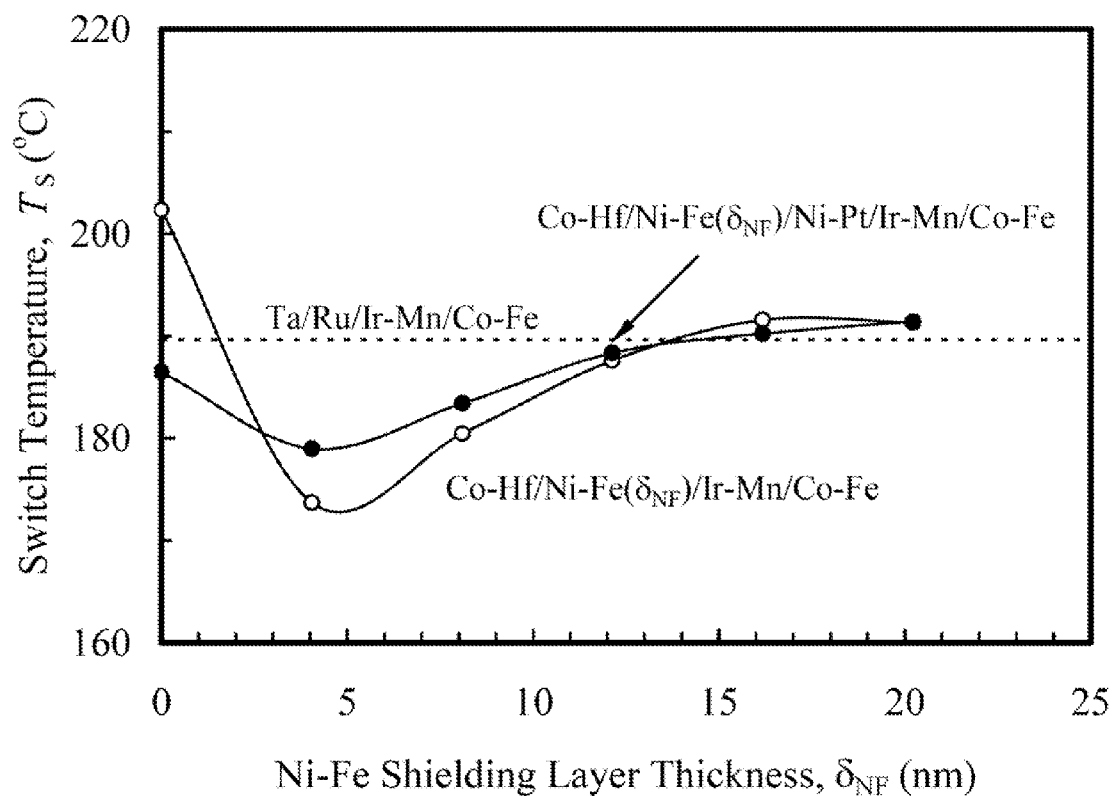
FIG. 21 is a chart showing $T_S$ versus the Ni—Fe shielding layer thickness for Co—Hf(2)/Ni—Fe/Ir—Mn(6)/Co—Fe(3.6)/Ru(2)/Ta(2)/Ru(4) and Co—Hf(2)/Ni—Fe/Ni—Pt(4)/Ir—Mn(6)/Co—Fe(3.6)/Ru(2)/Ta(2)/Ru(4) films after annealing for 5 hours at 280° C.

FIG. 21 shows $T_S$ versus the Ni—Fe shielding layer thickness ($\delta_{NF}$) for Co—Hf(2)/80.4Ni-19.6Fe($\delta_{NF}$)/Ir—Mn(6)/Co—Fe(3.6)/Ru(2)/Ta(2)/Ru(4) and Co—Hf(2)/80Ni-20Fe($\delta_{NF}$)/75.2Ni-24.8Pt(4)/Ir—Mn(6)/Co—Fe(3.6)/Ru(2)/Ta(2)/Ru(4) films after annealing for 5 hours at 280° C. Without the Ni—Fe shielding layer 1906 and the Ni—Pt seed layer 718, $T_S$ is unexpectedly as high as 202.3° C. $T_S$ decreases from 202.3 to 173.7° C. as $\delta_{NF}$ increases from 0 to 4 nm, but increases to 191.3° C. as $\delta_{NF}$ continues to increase to 20.2 nm. On the other hand, without the Ni—Fe shielding layer 1906 but with the Ni—Pt seed layer 718, $T_S$ is as high as 186.5° C. $T_S$ decreases from 186.5 to 179.0° C. as $\delta_{NF}$ increases from 0 to 4 nm, but increases to 191.4° C. as $\delta_{NF}$ continues to increase to 20.2 nm. Therefore, in both cases, to attain $T_S$ high than the desired (189.6° C.), it is recommended to use at least 16 nm thick Ni—Fe shielding layer 1906.

In order to ensure that the uses of the ferromagnetic Co—Fe buffer layer 316, the ferromagnetic Ni—Fe shielding layer 1906, and the ferromagnetic Ni—Pt seed layer 718 in accordance with the alternative embodiment of the invention will not lead to deterioration of magnetic and TMR properties, the CPP TMR read sensors 201, 301, 701, and 1901 in accordance with the prior arts, preferred and alternative embodiments of the invention are fabricated and evaluated as described below.

In the read head fabrication process, Ta(2)/Ru(2)/23.2Ir-76.8Mn(6), 75.5Co-24.5Hf(2)/Ru(2)/23.2Ir-76.8Mn(6), 75.5Co-24.5Hf(2)/75.2Ni-24.8Pt(4)/23.2Ir-76.8Mn(6), or 75.5Co-24.5Hf(2)/80.4Ni-19.6Fe(16.2)/75.2Ni-24.8Pt(4)/23.2Ir-76.8Mn(6) films are deposited on a bare glass substrate and on a wafer with a 1,000 nm thick ferromagnetic Ni—Fe lower shield 206 in a first module of a sputtering system, and 72.5Co-27.5Fe(1.6)/Co(0.3)/Ru(0.4)/Co(0.3)/75.5Co-24.5Hf(0.6)/65.5Co-19.9Fe-14.6B(1.3) films are then sequentially deposited in a second module of the sputtering system. The thickness of the keeper layer structure 222 is selected in order to attain a saturation moment of 0.28 memu/cm$^2$ (corresponding to that of a 4.0 nm thick ferromagnetic 88Ni-12Fe film sandwiched into two Cu films), while the thickness of the reference layer structure 224 is selected in order to attain a saturation moment of 0.26 memu/cm$^2$ (corresponding to that of a 3.7 nm thick ferromagnetic 88Ni-12Fe film sandwiched into two Cu films).

After the plasma treatment, the deposition of a 0.3 nm thick 46.8Co-53.2Fe film, and the formation of a 0.8 nm thick MgO$_X$ barrier layer 210 in a third module of the sputtering system in accordance with the preferred embodiment of the invention, 46.8Co-53.2Fe(0.5)/79.3Co-4.0Fe-16.7B(1.6)/75.5Co-24.5Hf(1.2)/95.8Ni-4.2Fe(3.2)/Ru(2)/Ta(2)/Ru(4) films are deposited in a fourth module of the sputtering system. The thickness of the sense layer structure 1928 is selected in order to attain a saturation moment of 0.42 memu/cm$^2$ (corresponding to that of a 6 nm thick ferromagnetic 88Ni-12Fe film sandwiched into two Cu films). After annealing in a magnetic field of 50,000 Oe for 5 hours at 280° C. in a high-vacuum oven, the CPP TMR read sensor deposited on the bare glass substrate is measured with the VSM to characterize magnetic properties. On the other hand, the CPP TMR read sensor deposited on the wafer with the ferromagnetic Ni—Fe lower shield 206 is coated with top conducting leads formed of Cu(75)/Ru(12) films, and is probed with a 12-point microprobe in a magnetic field of about 160 Oe. Measured data from any four of the microprobe are analyzed with a current-in-plane tunneling model to characterize TMR properties.

The CPP TMR read sensor 1901 in accordance with the alternative embodiment of the invention differs from the CPP TMR read sensor 701 in accordance with the preferred embodiment of the invention. First, a 16.2 nm thick Ni—Fe shielding layer 1906 is sandwiched between the Co—Hf buffer layer 316 and the Ni—Pt seed layer 718. Second, the second keeper layer and the first reference layer are formed of 0.3 nm thick Co films, instead of 0.6 nm thick 64.1Co-35.9Fe films. Third, the thickness of the Ru antiparallel coupling layer 226 is reduced from 0.8 to 0.4 nm. Fourth, the first sense layer is formed of a 0.5 nm thick 46.8Co-53.2 Fe film, instead of a 0.4 nm thick 87.1Co-12.9Fe film. Fifth, the third sense layer is formed of a 1.2 nm thick 75.5Co-24.5Hf film, instead of a 2.8 nm thick 87.1Co-12.9Hf film. Sixth, a fourth sense layer formed of a 3.2 nm thick 95.8Ni-4.2Fe film is incorporated into the CPP TMR read sensor 1901. As a result, the flux closure of the CPP TMR read sensor is miniaturized by 1 nm but reinforced to attain high $H_{SF}$ and $H'_{SF}$, while the sense layer structure is expanded by 1.6 nm to attain better sense layer properties.

Figure 22:
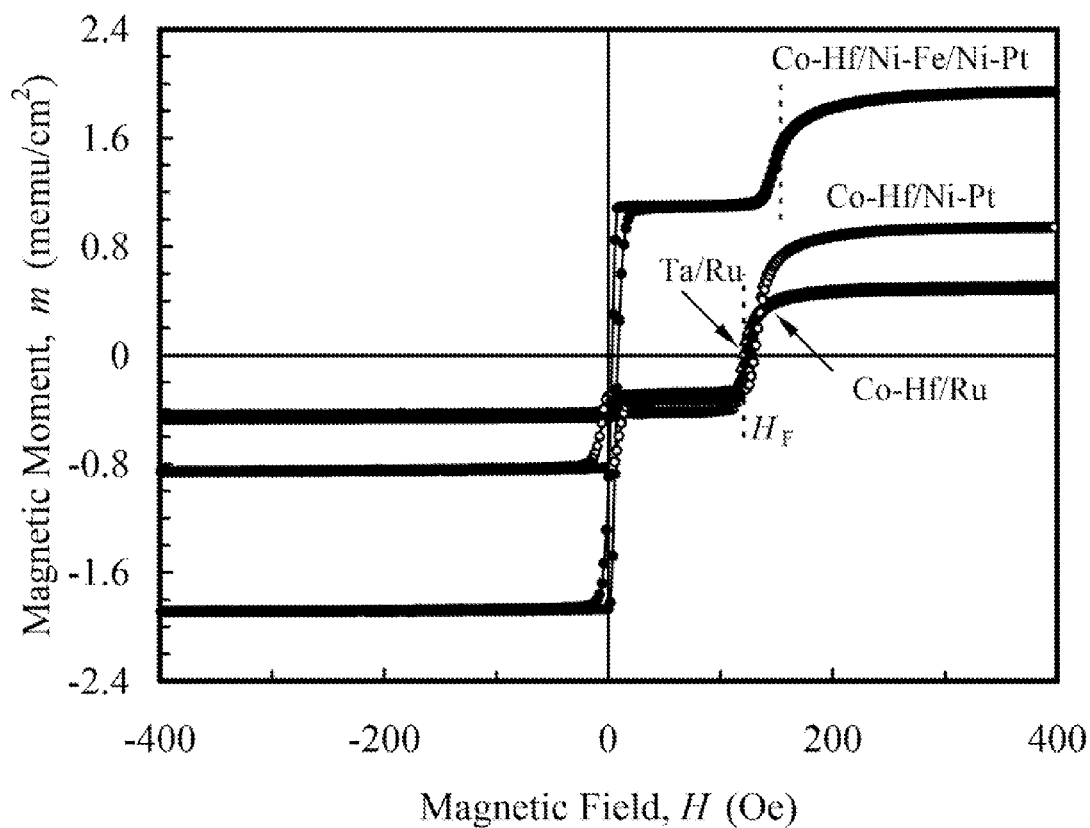
FIG. 22 is a chart showing low-field easy-axis magnetic responses of CPP TMR read sensors with various buffer, shielding and seed layers after annealing for 5 hours at 280° C.

FIG. 22 shows low-field easy-axis magnetic responses of the CPP TMR read sensors with various buffer, shielding and seed layers after annealing for 5 hours at 280° C. In addition to two centered hysteresis loops similar to those shown in FIG. 17, a very larger centered hysteresis loop originating from the easy-axis magnetic responses of the ferromagnetic Co—Hf buffer layer 316, the ferromagnetic Ni—Fe shielding layer 1906, and the ferromagnetic Ni—Pt seed layer 718 can be identified. Its magnetic moment is as high as 1.32 memu/cm$^2$ due to the incorporation of the 16.2 nm thick ferromagnetic Ni—Fe shielding layer 1906 into the CPP TMR read sensor 1901. On the other hand, four shifted hysteresis loops originating from the easy-axis magnetic responses of the sense layer structure 1928 can be identified. With the Ta buffer/Ru seed, Co—Hf buffer/Ru seed, Co—Hf buffer/Ni—Pt seed and Co—Hf buffer/Ni—Fe shielding/Ni—Pt seed layers, the sense layer structures 1928 exhibit $H_C$ values of 1.5, 1.0, 0.9 and 2.3 Oe, respectively, and $H_F$ values of 114.1, 119.9, 127.0 and 125.7 Oe, respectively. A comparison between FIGS. 17 and 22 reveals that the incorporation of the ferromagnetic Ni—Fe sense layer into the sense layer structure 1928 leads to lower $H_C$ and $H_F$.

Figure 23:
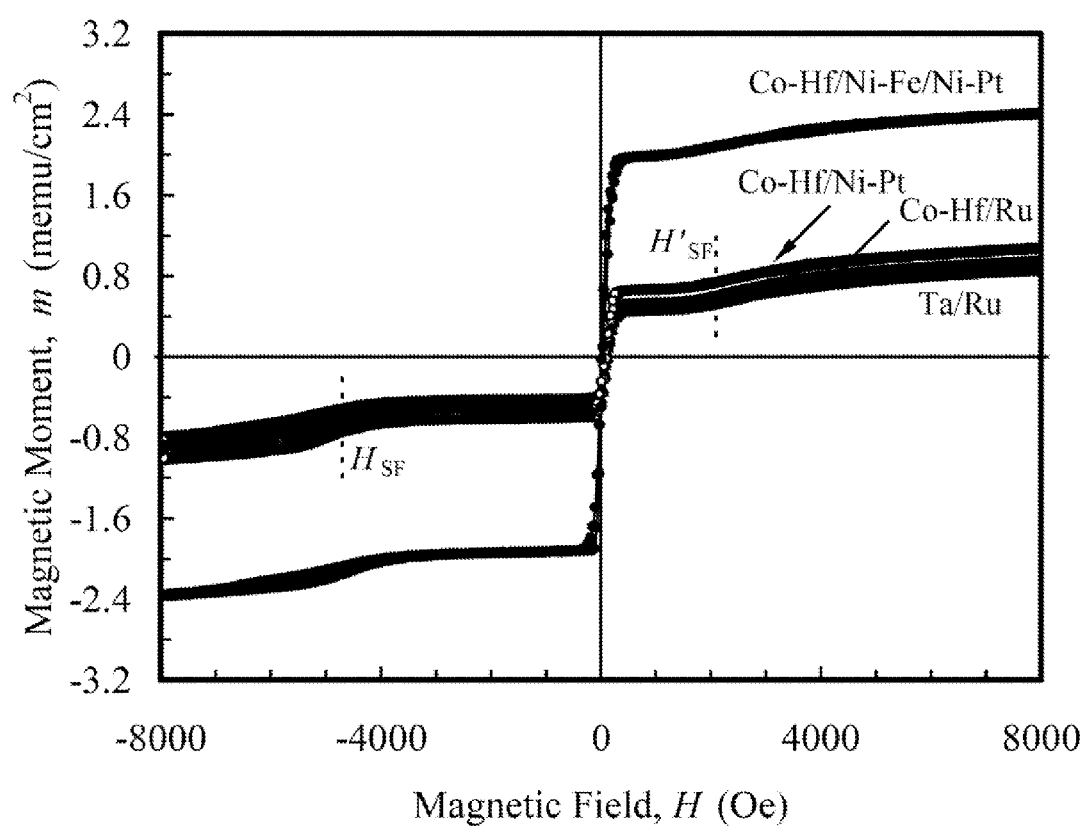
FIG. 23 is a chart showing high-field easy-axis magnetic responses of CPP TMR read sensors with various buffer, shielding and seed layers after annealing for 5 hours at 280° C.

FIG. 23 shows high-field easy-axis magnetic responses of the CPP TMR read sensors with various buffer, shielding and seed layers after annealing for 5 hours at 280° C. Left and right tilted hysteresis loops originating from the easy-axis magnetic responses of the keeper-layer structure 1922 and the reference-layer structure 1924, respectively, differ from those shown in FIG. 18 in that their magnetic moments are just partially detected due to the enforcement of the flux closure to an antiparallel-coupling strength beyond 8,000 Oe. With the Ta buffer/Ru seed, Co—Hf buffer/Ru seed, Co—Hf buffer/Ni—Pt seed and Co—Hf buffer/Ni—Fe shielding/Ni—Pt seed layers, the keeper layer structures 1922 exhibit $H_{SF}$ values of 4,731, 4,851, 4,651 and 4,369 Oe, respectively, while the reference layer structures 1924 exhibit $H'_{SF}$ values of 2,106, 2,023, 2,063 and 2,066 Oe, respectively. Therefore, the CPP TMR read sensors with various buffer, shielding and seed layers exhibit comparable magnetic properties.

Table 4 summarizes $H_C$, $H_F$, $H_{SF}$, $H'_{SF}$, $R_J A_J$ and $\Delta R_T/R_J$ determined from easy-axis magnetic and resistance responses of the CPP TMR read sensors with various buffer, shielding and seed layers after annealing for 5 hours at 280° C. in accordance with the prior arts, preferred and alternative embodiments of the invention. With the Ta buffer/Ru seed, Co—Hf buffer/Ru seed, Co—Hf buffer/Ni—Pt seed layers, and Co—Hf buffer/Ni—Fe shielding/Ni—Pt seed layers, the CPP TMR read sensors exhibit $R_J A_J$ values of 0.68, 0.67, 0.67 and 0.61 Ω-μm$^2$, respectively, and $\Delta R_T/R_J$ values of 69.4, 67.2, 66.2 and 51.2%, respectively. These CPP TMR read sensors with identical MgO$_X$ barrier layers 210 are expected to exhibit identical reliabilities. The incorporation of the Ni—Fe shielding layer 1906 thus leads to an decrease in $R_J A_J$ by 0.07 Ω-μm$^2$, while maintaining the identical reliability.

Since the Ni—Fe shielding layer 1906 in accordance with the alternative embodiment of the invention is preferably thick enough to produce a large grain morphology needed for low $R_J A_J$ and high $T_S$, it may require a plasma treatment to minimize its wavy topography and an additional photolithographic mask to entirely remove it in unmasked regions on the wafer, as described below. In the read head fabrication process, chemical-mechanical polishing is applied to the wafer to expose an Al$_2$O$_3$ underlayer and smoothen the ferromagnetic lower shield 206 that is embedded in the Al$_2$O$_3$ underlayer, and the CPP TMR read sensor 1901 is then deposited on the wafer. A photolithographic mask is needed to entirely remove the CPP TMR read sensor 1901 deposited on the Al$_2$O$_3$ underlayer, while two photolithographic masks as used in the prior arts are still needed to partially remove the CPP TMR read sensor 1901 deposited on the ferromagnetic lower shield 206 until the Ni—Fe shielding layer 1906 is exposed.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A read sensor comprising:
a buffer layer formed of a ferromagnetic, amorphous film;
a shielding layer formed of a ferromagnetic, polycrystalline film on the buffer layer;
a seed layer formed of a ferromagnetic, polycrystalline film on the shielding layer; and
a pinning layer formed of an antiferromagnetic, polycrystalline film on the seed layer wherein the buffer layer contains cobalt (Co) with a content ranging from 70 to 94 at % and X with a content ranging from 6 to 30 at %, where X is hafnium (Hf), zirconium (Zr), yttrium (Y) or boron (B), and has a thickness ranging from 0.6 to 4 nm.

2. The read sensor as in claim 1 wherein the shielding layer exhibits a face-centered-cubic (fcc) structure.

3. The read sensor as in claim 1 wherein the shielding layer contains nickel (Ni) with a content ranging from 60 to 100 at % and iron (Fe) with a content ranging from 0 to 40 atomic percent, and has a thickness ranging from 4 to 40 nm.

4. The read sensor as in claim 1, wherein the seed layer exhibits a face-centered-cubic (fcc) structure with a lattice constant nearly equivalent to that of the pinning layer, and does not exchange-couple with the pinning layer.

5. The read sensor as in claim 1, wherein the pinning layer contains iridium (Ir) with a content ranging from 16 to 24 at % and manganese (Mn) with a content ranging from 76 to 84 at %, and has a thickness ranging from 4 to 8 nm.

6. The read sensor as in claim 1, further comprising
a keeper layer structure formed of ferromagnetic films on the pinning layer;
an antiparallel-coupling layer formed of a nonmagnetic film on the keeper layer structure;

| Buffer Layer | Shielding Layer | Seed Layer | $H_C$ (Oe) | $H_F$ (Oe) | $H_{SF}$ (Oe) | $H'_{SF}$ (Oe) | $R_J A_J$ (Ω-μm$^2$) | $\Delta R_T/R_J$ (%) |
|---|---|---|---|---|---|---|---|---|
| Ta(2) | None | Ru(2) | 1.5 | 114.1 | 4,731 | 2,106 | 0.64 | 66.0 |
| Co—Hf(2) | None | Ru(2) | 1.0 | 119.9 | 4,851 | 2,023 | 0.63 | 61.3 |
| Co—Hf(2) | None | Ni—Pt(4) | 0.9 | 127.0 | 4,651 | 2,063 | 0.63 | 60.6 |
| Co—Hf(2) | Ni—Fe(16) | Ni—Pt(4) | 2.3 | 125.7 | 4,369 | 2,066 | 0.59 | 49.0 | a reference layer structure formed of ferromagnetic films on the antiparallel-coupling layer;

a barrier or spacer layer formed of a nonmagnetic film on the reference layer structure;

a sense layer structure formed of ferromagnetic films on the barrier or spacer layer; and a cap layer structure formed of nonmagnetic films on the sense layer structure.

7. A read sensor comprising:

a buffer layer formed of a ferromagnetic, amorphous film;

a shielding layer formed of a ferromagnetic, polycrystalline film on the buffer layer;

a seed layer formed of a ferromagnetic, polycrystalline film on the shielding layer; and a pinning layer formed of an antiferromagnetic, polycrystalline film on the seed layer; wherein the seed layer contains nickel (Ni) with a content ranging from 64 to 80 at % and X with a content ranging from 20 to 36 at %, where X is platinum (Pt), palladium (Pd), rhodium (Rh) or ruthenium (Ru), and has a thickness ranging from 2 to 20 nm.

8. A read head including a read sensor comprising a buffer layer formed of a ferromagnetic, amorphous film;

a shielding layer formed of a ferromagnetic, polycrystalline film on the buffer layer;

a seed layer formed of a ferromagnetic, polycrystalline film on the shielding layer; and a pinning layer formed of an antiferromagnetic, polycrystalline film on the seed layer;

wherein the buffer layer contains cobalt (Co) with a content ranging from 70 to 94 at % and X with a content ranging from 6 to 30 at %, where X is hafnium (Hf), zirconium (Zr), yttrium (Y) or boron (B), and has a thickness ranging from 0.6 to 4 nm.

9. A read head as in claim 8 comprising a lower shield formed of a ferromagnetic, polycrystalline film beneath the read sensor; and an upper shield formed of a ferromagnetic, polycrystalline film on the read sensor.

10. The read head as in claim 9 wherein the shielding layer has a composition nearly equivalent to that of the lower shield.

11. A read head as in claim 8 further comprising an insulation layer in each of two side regions adjacent to the read sensor; and a longitudinal bias stack on the insulation layer in each of the two side regions.

12. The read head as in claim 8, further comprising a free layer having first and second sides and wherein the buffer layer extends laterally beyond the first and second sides of the free layer and acts as a portion of the shielding layer.

13. The read head as in claim 8 wherein the shielding layer exhibits a face-centered cubic (fcc) structure.

14. The read head as in claim 8 wherein the shielding layer contains nickel (Ni) with a content ranging from 60 to 100 at % and iron (Fe) with a content ranging from 0 to 40 atomic percent, and has a thickness ranging from 4 to 40 nm.

15. The read head as in claim 8, wherein the seed layer exhibits a face-centered-cubic (fcc) structure with a lattice constant nearly equivalent to that of the pinning layer, and does not exchange-couple with the pinning layer.

16. The read head as in claim 8, further comprising a free layer having first and second sides and wherein the seed layer extends laterally beyond the first and second sides of the free layer and acts as a portion of the shielding layer.

17. The read head as in claim 8, wherein the upper surface of the seed layer defines the lower bound of a read gap.

18. The read head as in claim 8, wherein the pinning layer contains iridium (Ir) with a content ranging from 16 to 24 at % and manganese (Mn) with a content ranging from 76 to 84 at %, and has a thickness ranging from 4 to 8 nm.

19. The read head as in claim 8, wherein the read sensor further comprises a ferromagnetic keeper layer structure formed on the pinning layer;

a nonmagnetic antiparallel-coupling layer formed on the ferromagnetic keeper layer structure;

a ferromagnetic reference layer structure formed on the nonmagnetic antiparallel-coupling layer;

a nonmagnetic barrier or spacer layer formed on the ferromagnetic reference layer structure;

a ferromagnetic sense layer structure formed on the nonmagnetic barrier or spacer layer; and a nonmagnetic cap layer structure formed on the ferromagnetic sense layer structure.

20. A method of evaluating thermal properties of the read sensor as in claims 1 and 8 by detecting two peaks of anisotropy magnetoresistance coefficients from resistance responses as a function of baking temperatures.

21. A read head including a read sensor comprising a buffer layer formed of a ferromagnetic, amorphous film;

a shielding layer formed of a ferromagnetic, polycrystalline film on the buffer layer;

a seed layer formed of a ferromagnetic, polycrystalline film on the shielding layer; and a pinning layer formed of an antiferromagnetic, polycrystalline film on the seed layer;

wherein the seed layer contains nickel (Ni) with a content ranging from 64 to 80 at % and X with a content ranging from 20 to 36 at %, where X is platinum (Pt), palladium (Pd), rhodium (Rh) or ruthenium (Ru), and has a thickness ranging from 2 to 20 nm.

* * * * *